(12) United States Patent
Takaya et al.

(10) Patent No.: US 6,915,944 B1
(45) Date of Patent: Jul. 12, 2005

(54) SOLDERING FLUX, SOLDER PASTE AND METHOD OF SOLDERING

(75) Inventors: Minoru Takaya, Tokyo (JP); Hisayuki Abe, Tokyo (JP)

(73) Assignee: TDK Corporation, Tokyo (JP)

( * ) Notice: Subject to any disclaimer, the term of this patent is extended or adjusted under 35 U.S.C. 154(b) by 213 days.

(21) Appl. No.: 10/089,067

(22) PCT Filed: Oct. 5, 2000

(86) PCT No.: PCT/JP00/06957

§ 371 (c)(1),
(2), (4) Date: Apr. 5, 2002

(87) PCT Pub. No.: WO01/24968

PCT Pub. Date: Apr. 12, 2001

(30) Foreign Application Priority Data

| | | |
|---|---|---|
| Oct. 5, 1999 | (JP) | 11/284859 |
| Mar. 23, 2000 | (JP) | 2000/083001 |
| Jul. 18, 2000 | (JP) | 2000/218046 |

(51) Int. Cl.[7] .............................................. B23K 1/20
(52) U.S. Cl. ...................................... 228/223; 148/23
(58) Field of Search ................................ 228/223, 224, 228/180.21, 180.22, 214, 217, 248.1, 56.3; 148/23, 24, 25; 438/108, 612, 613, 614

(56) References Cited

U.S. PATENT DOCUMENTS

| | | | | |
|---|---|---|---|---|
| 4,479,983 A | * | 10/1984 | Appelt et al. | 427/493 |
| 4,789,411 A | * | 12/1988 | Eguchi et al. | 148/24 |
| 4,940,498 A | * | 7/1990 | Rubin | 148/23 |
| 5,004,509 A | * | 4/1991 | Bristol | 148/23 |
| 5,128,746 A | | 7/1992 | Pennisi et al. | |
| 5,211,763 A | * | 5/1993 | Takemoto et al. | 148/23 |
| 5,904,782 A | * | 5/1999 | Diep-Quang | 148/23 |
| 5,907,007 A | | 5/1999 | Ito et al. | |
| 6,228,678 B1 | * | 5/2001 | Gilleo et al. | 438/108 |
| 6,340,113 B1 | * | 1/2002 | Avery et al. | 228/248.5 |
| 6,592,020 B1 | * | 7/2003 | Currie et al. | 228/224 |

FOREIGN PATENT DOCUMENTS

| | | |
|---|---|---|
| DE | 42 35 575 A1 | 4/1994 |
| JP | 59-5698 | 1/1984 |
| JP | 60-88495 | 5/1985 |
| JP | 6-269980 | 9/1994 |
| JP | 7-80682 | 3/1995 |
| JP | 8-90283 | 4/1996 |
| JP | 8-174264 | 7/1996 |
| JP | 11-121915 | 4/1999 |
| WO | WO 96/37336 | 11/1996 |

OTHER PUBLICATIONS

"Latest mounting technology" Anbe Mounting Technology Institute Ltd., EP/US BAG/CSP/FC, pp. 18–27 '99 Overseas Technology Know–how Report, Jun. 1999.

Taro Hukui: "Required characteristic and developing direction in under fill materials" High–Density Mounting Technology, vol. 5, pp. 116–122, Nov. 9, 1999.

* cited by examiner

Primary Examiner—Jonathan Johnson
(74) Attorney, Agent, or Firm—Oblon, Spivak, McClelland, Maier & Neustadt, P.C.

(57) ABSTRACT

The present invention relates to a soldering flux, a soldering paste and a soldering method that achieve a sufficient degree of bonding strength even when components are mounted at a higher density, components are further miniaturized or components are mounted with a smaller pitch. A flux 3 contains an adhesive resin and a hardening agent. This flux or a soldering paste containing the flux is applied onto a component mounting board 1, and then, an electronic component 4 is mounted and soldered onto the component mounting board 1.

60 Claims, 22 Drawing Sheets

SOLDERING FLUX, SOLDER PASTE AND METHOD OF SOLDERING

BACKGROUND OF THE INVENTION

1. Field of the Invention

The present invention relates to a soldering flux, soldering paste, an electronic component device, an electronic circuit module, an electronic circuit apparatus and a soldering method.

2. Description of the Prior Art

A flux is used to solder a component onto a component mounting board in the known art. The main function of the flux is to improve the wettability of the solder by removing the oxide film formed at a metal conductor provided at the component mounting board and also at the surface of the metal to be soldered at the component. Among fluxes used in the related art, those containing rosin as the primary constituent are the best known. Rosin contains a carboxylic acid such as abietic acid or levopimaric acid, and the carboxyl group acts to remove the oxide film at the surface of the metal to be soldered.

Various additives such as solvents, plasticizers and thixotropic agents are normally mixed into a flux to improve the printability and increase the retentive strength. For instance, Japanese Unexamined Patent Publication No. 1999-121915 discloses a flux, the viscosity of which is adjusted by adding alcohol.

Other types of fluxes include the RMA (halogen-free) type fluxes conforming to the MIL Standard. This type of flux eliminates the necessity of washing the flux and the like after the reflow process.

Since none of the fluxes described above are used to bond the soldered component following the soldering process, the solder joint is achieved through fusion joining of the metal to be soldered. Accordingly, the degree of strength with which the metals to be soldered are bonded with each other is determined by the size of the solder joint area.

As components become further miniaturized to keep pace with higher density mounting pursued in various types of electronics devices, the pitch representing the distance between the individual components is becoming smaller, which, in turn, has resulted in a drastically reduced solder joint area. Thus, it is difficult to ensure a sufficient soldering strength even today. Since it is expected that higher density at the mounting board, further miniaturization of components and a smaller pitch between individual components will be pursued with increasing vigor in the future, it will become even more difficult to support this technical trend with the means for assuring the bonding strength in the related art that achieves the required bonding strength simply by allowing the solder joint to be formed over a large enough area.

The required solder joint strength is normally assured by forming a solder fillet portion and thus, increasing the solder joint area where a terminal of the component and a conductor (a land or a solder bump) on the component mounting board become soldered to each other. However, since the bonding area of the fillet portion itself is bound to be reduced in high-density mounting, the fillet portion cannot readily contribute to an increase in the bonding strength.

In addition, when manufacturing various types of electronic circuit modules, for instance, a component mounting board that allows components to be mounted on both sides is often utilized so that after soldering components in a furnace, onto one surface of the component mounting board with a high-temperature solder, components are mounted onto the other surface and the board undergoes a soldering process in the furnace again. This means that when soldering the components onto the other surface of the component mounting board, it is necessary to use a low-temperature solder having a lower melting point than the high-temperature solder used on the first side. In the prior art, the melting point of a solder is usually adjusted in conformance to Pb content.

At the same time, in response to the demand for solders that do not contain Pb (hereinafter referred to Pb-free solders) by the advocates of global environment conservation, great effort has been invested in at developing solders with Pb-free composition in recent years. However, no Pb-free solder composition with a high melting point comparable to that of a high-temperature solder in the prior art has been put into practical use to date. The main obstacle is that the melting point of Pb-free solder itself is approximately 220° C. that is higher than the melting point of a eutectic solder by as much as 40° C. and thus, no effective alternative to Pb has been discovered. Consequently, the issue of insufficient difference between the melting points of the solders used on the two sides of a double-sided installation type component mounting board is yet to be addressed, and the problem of components becoming lifted off or falling off when they are mounted onto the component mounting board is still common.

Furthermore, when manufacturing an electronic circuit module using semiconductor chips, an additional work process is implemented after the semiconductor chips are soldered onto the chip mounting board. A sealant is applied onto the bonding interface to firmly bond the semiconductor chips to the chip mounting board with the sealant.

However, if there is any residual flux present when the sealant is injected, the flux prevents the sealant from reaching the interface between the semiconductor chips and the board in sufficient quantity and thus, the sealant fails to achieve its full bonding strength. Accordingly, a process of washing away the flux is added before injecting the sealant. Under normal circumstances, the flux washing process is implemented by using a volatile organic solvent in a plurality of separate steps. However, stricter regulations are imposed today on the use of volatile organic solvents for environmental protection, and thus, the flux washing process has become an onerous process from the viewpoints of both cost effectiveness and environmental protection.

Moreover, when a combination of a ceramic substrate and an organic resin substrate is adopted to constitute the chip mounting board and the motherboard respectively to manufacture an electronic circuit apparatus by mounting an electronic circuit module obtained through the process described above onto the motherboard, the contraction stress tends to concentrate in the solder joint to result in cracks to occur readily in the solder joint to result in a reduction in the durability of the joints due to the difference between the coefficients of thermal expansion of the ceramic board and the organic resin board, as proven in thermal shock tests and the like conducted after the electronic circuit module is mounted. While it would be desirable to inject a sealant in order to improve the strength of the solder joint for this reason, it would lead to a considerable increase in the production cost to implement a flux washing process and a sealant injection process on the entire motherboard, and thus, the sealant is not injected in reality.

SUMMARY OF THE INVENTION

It is an object of the present invention to provide a soldering flux, a soldering paste and a soldering method that achieve a sufficient degree of bonding strength while allowing higher mounting density; further miniaturization of components and a reduction in the pitch at which components are set.

It is a further object of the present invention to provide a soldering flux, a soldering paste and a soldering method that prevent components from becoming lifted off or falling off with a high degree of reliability without having to ensure a sufficient difference between the melting points of the solders used at the two surfaces of a double-sided installation type component mounting board.

It is a still further object of the present invention to provide an electronic component device, an electronic circuit module and an electronic circuit apparatus that may be manufactured at low production costs without requiring a flux washing process.

It is a still further object of the present invention to provide an electronic component device, an electronic circuit module and an electronic circuit apparatus achieving a high degree of reliability, in that the durability of the solder joint is greatly increased compared to that in the prior art.

In order to achieve the objects described above, the soldering flux according to the present invention contains an adhesive resin and a hardening agent.

Since the flux according to the present invention contains an adhesive resin and a hardening agent, the adhesive resin can be used as an adhesive to secure a component to the component mounting board after the soldering process. As a result, the reliability of the solder joint is improved by preventing the component from peeling or falling off due to an impact force or thermal stress. This greatly differentiates the flux according to the present invention from the rosin flux in the prior art that does not act as an adhesive after the soldering process.

In addition, by using the flux according to the present invention, a sufficient bonding strength can be assured without having to form a fillet portion. Thus, since it is not necessary to provide an area for the formation of the fillet portion at a conductor for component connection (land) formed on the component mounting board, an improvement in the mounting density is achieved.

The adhesive resin contained in the flux according to the present invention may be a highly adhesive resin selected from numerous resin materials in conformance to temperature requirements. The selection of such a resin ensures that even when the standard eutactic solder is used on the second surface of the double-sided installation type component mounting board and the component mounting board is processed in a reflow furnace after components are soldered onto the first surface of the component mounting board by utilizing the flux according to the present invention, the components mounted at the first surface do not manifest such problems as shifting, the so-called Manhattan phenomenon (the raised component phenomenon) and falling. It goes without saying that the flux according to the present invention may be utilized in the soldering processes on both the first surface and the second surface.

The flux according to the present invention may be achieved in either a liquid form or a paste form. Such a flux can be applied onto the component mounting board or the like with ease through a means such as printing, dispenser application, spraying or brush application.

It is desirable to constitute the adhesive resin in the flux according to the present invention with a thermo-setting resin. More specifically, the thermo-setting resin may be constituted of at least one resin selected from epoxy resins, phenol resins, polyimide resins, silicon resins, modified resins and acrylic resins. A selection may be made from the resin materials listed above and the selected material(s) may be mixed at quantities set in conformance to bonding temperature range, target film hardness and the like.

The hardening agent must be capable of hardening the adhesive resin. In a desirable mode, the hardening agent contains a carboxylic acid. A hardening agent containing a carboxylic acid can be utilized as a flux for removing the oxide film formed at the surface of the metal to be soldered as well as an agent that hardens the thermo-setting resin.

The flux according to the present invention may contain a solvent, a plasticizer, a thixotropic agent and the like as well. The solvent is added to enable adjustment of setting temperature and setting speed of the adhesive resin and also to enable adjustment of the viscosity in conformance to the application mode. The plasticizer and the thixotropic agent, too, are added to enable adjustment of the viscosity in conformance to the mode of application. The quantities of the solvent, the plasticizer, the thixotropic agent and the like that are added are set in conformance to the specific purpose of use.

The flux according to the present invention may be achieved in the form of a micro-capsule having an adhesive resin, an organic acid that achieves a deoxidation effect, a carboxylic acid, a solvent and a hardening agent sealed therein.

In addition, the flux according to the present invention may be mixed with soldering powder to form a soldering paste. The soldering powder may be constituted of a substance selected from Sn, Cu, Ag, Sb, Pb, In, Zn and Bi. A Pb-free soldering paste can be achieved by using soldering powder other than Pb.

The present invention also discloses an electronic component device, an electronic circuit module and an electronic circuit apparatus achieved by using the flux described above. The electronic component device according to the present invention includes at least one electronic component, a component mounting board and a soldering flux. The electronic component is soldered onto the component mounting board. The soldering flux, that contains an adhesive resin and a hardening agent, is present between the electronic component and the component mounting board to bond the electronic component and the component mounting board to each other.

The soldering flux present between the electronic component and the component mounting board, contains the adhesive resin and the hardening agent, functions as an adhesive. This soldering flux does not need to be washed and can be directly utilized as an adhesive soldering flux. As a result, an electronic component device can be manufactured at low production cost without having to implement a flux washing process. Furthermore, since the soldering flux containing the adhesive resin and the hardening agent functions as an adhesive, a highly reliable electronic component device in which the solder joint durability is greatly increased compared to the prior art is achieved.

The electronic circuit module according to the present invention includes a semiconductor chip, a chip mounting board and a soldering flux. The semiconductor chip includes at least one semiconductor element and is soldered onto the chip mounting board. The soldering flux that contains an adhesive resin and a hardening agent is present between the semiconductor chip and the chip mounting board to bond the semiconductor chip and the chip mounting board to each other.

The soldering flux present between the semiconductor chip and the chip mounting board, that contains the adhesive resin and the hardening agent, functions as an adhesive. This soldering flux does not need to be washed and can be directly utilized as an adhesive soldering flux. As a result, an electronic circuit module can be manufactured at low production cost without having to implement a flux washing process. Furthermore, since the soldering flux containing the adhesive resin and the hardening agent functions as an adhesive, a highly reliable electronic circuit module in that the solder joint durability is greatly increased compared to the prior art is achieved.

The electronic circuit apparatus according to the present invention includes an electronic circuit module, a motherboard and a soldering flux. The electronic circuit apparatus is soldered onto the motherboard. The soldering flux that contains an adhesive resin and a hardening agent is present between the semiconductor chip and the motherboard to bond them to each other. This soldering flux does not need to be washed and can be directly utilized as an adhesive soldering flux. As a result, an electronic circuit apparatus can be manufactured at low production cost without having to implement a flux washing process. Furthermore, since the soldering flux containing the adhesive resin and the hardening agent functions as an adhesive, a highly reliable electronic circuit apparatus in which the solder joint durability is greatly increased compared to the prior art is achieved.

The present invention further discloses a soldering method achieved by using the flux and the soldering paste described above.

BRIEF DESCRIPTION OF THE PREFERRED EMBODIMENTS

1, Flux, Soldering Paste and Application Thereof in Electronic Component Device

EMBODIMENT 1

Bisphenol A was used to constitute the thermo-setting resin and an anhydride of carboxylic acid was used as a hardening agent. The mixing ratio of the thermo-setting resin and the hardening agent was set at 1:1 by weight. In addition, a required degree of viscosity was assured by mixing in small quantities of a solvent and a thixotropic agent.

Figure 1A:
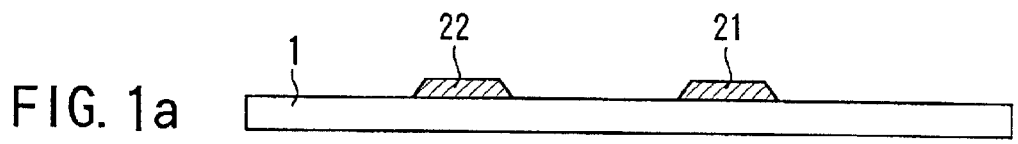
FIG. 1 presents partial cross-sectional views illustrating a chip component soldering method achieved by using the flux according to the present invention.
Figure 1B:
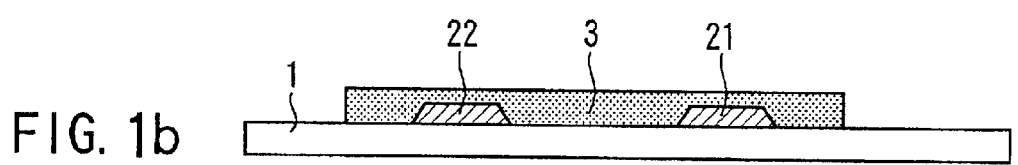

A flux 3 prepared by adopting the composition described above was applied (see FIG. 1b) onto a component mounting board 1 (see FIG. 1a) upon which solder bumps 21 and 22 had been deposited in advance. Next, as illustrated and FIG. 1c, an electronic component 4 achieved as a 1 mm (length)× 0.5 mm (width) chip was mounted. The electronic component 4 having terminal electrodes 41 and 42 provided at the two ends of a base body 40 to face opposite each other was mounted onto the component mounting board 1 so as to set the terminal electrodes 41 and 42 on the solder bumps 21 and 22 respectively. The component mounting board 1 having been mounted with the electronic component 4 was processed in a reflow furnace to solder-bond the terminal electrodes 41 and 42 provided at the two ends of the base body 40 of the electronic component 4 to the solder bumps 21 and 22. Through this process, an electronic component device according to the present invention was obtained. The flux 3 that filled the gap formed between the electronic component 4 and the component mounting board 1 functioned as an adhesive soldering flux. The electronic component 4 and the electronic component device thus obtained was pushed in a lateral direction F1 as shown in FIG. 2 to measure the component shear strength.

COMPARISON EXAMPLE 1

Figure 1C:
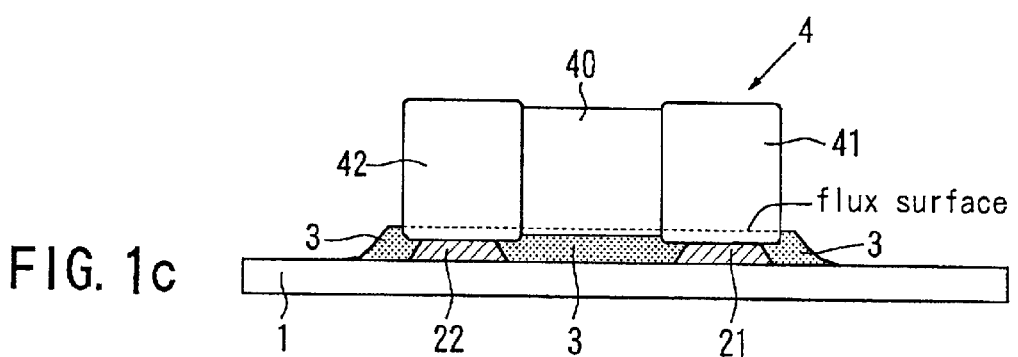
Figure 2:
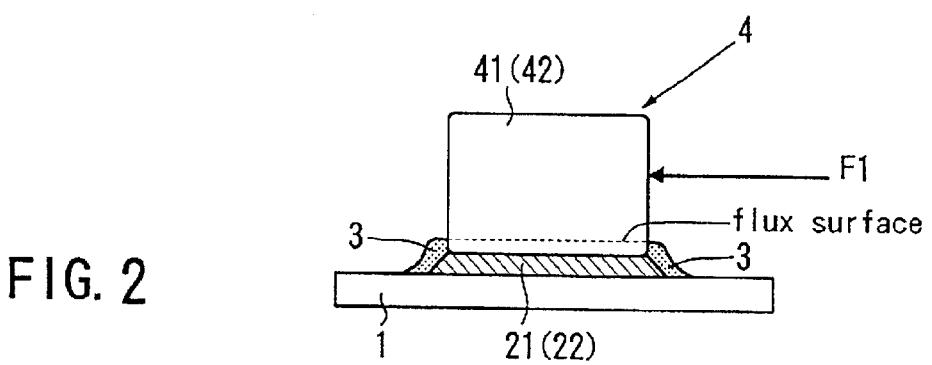
FIG. 2 presents a partial cross-sectional view illustrating the method adopted to conduct a component shear strength test to measure the strength against a shear force applied to a chip component soldered onto the component mounting board.

For purposes of comparison, a component was mounted and soldered as shown in FIG. 1c by using a rosin flux in the prior art, and then, the component shear strength of the soldered component was measured through the testing method illustrated in FIG. 2.

Figure 3:
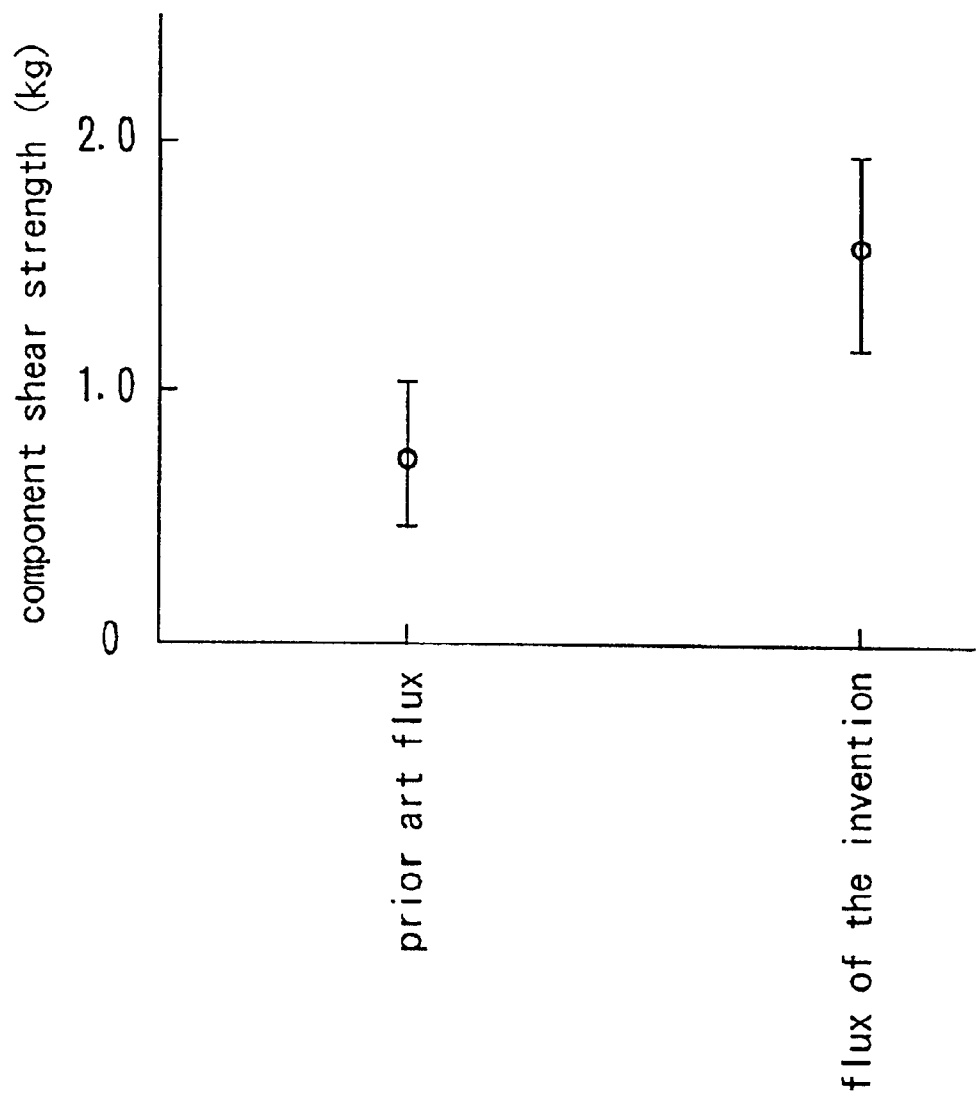
FIG. 3 presents the results of the component shear strength test illustrated in FIG. 2.

FIG. 3 shows the results of the shear strength tests. As shown in FIG. 3, while the shear strength average achieved in comparison with embodiment 1, in which the rosin flux was used as in the prior art was approximately 800 g, an approximate shear strength average of 1600 g was achieved in embodiment 1 in which the flux according to the present invention was used.

The flux filling the gap formed between the electronic component 4 and the component mounting board 1 contains the adhesive resin and the hardening agent, and thus it can be used as an adhesive material. This flux (soldering flux) 3 does not need to be washed and can be directly utilized as an adhesive soldering flux. As a result, an electronic component device can be manufactured at low production cost without having to implement a flux washing process. In addition, since the soldering flux constituted of the flux 3 that contains the adhesive resin and the hardening agent functions as an adhesive soldering flux, a highly reliable electronic component device achieving a far greater durability in the solder joints is obtained.

EMBODIMENT 2

Figure 4A:
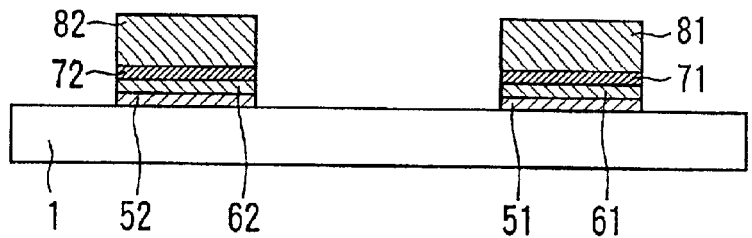
FIG. 4 presents partial cross-sectional views illustrating the component mounting board in detail and the soldering process implemented to solder a chip component onto the component mounting board by using a soldering paste containing the flux according to the present invention.
Figure 4B:
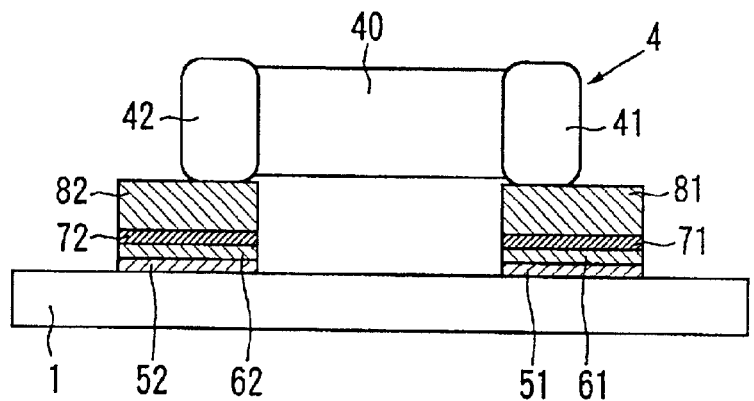
Figure 4C:
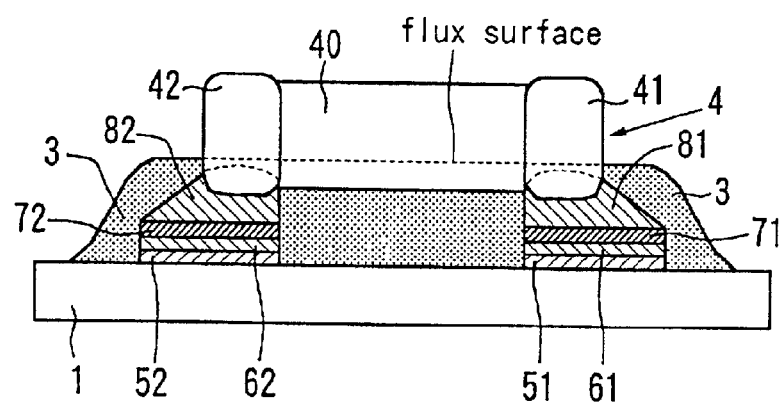

A soldering paste was prepared by mixing the flux prepared in embodiment 1 with soldering powder. The quantity of the flux that was mixed relative to the quantity of the soldering powder was set at 10 wt %. A chip component was soldered onto a component mounting board using this soldering paste. FIGS. 4a through 4c present partial cross-sectional views, showing the component mounting board in detail and the soldering process through which the chip component was soldered onto the component mounting board. The component mounting board 1 included two lands formed by sequentially laminating a Cu film 51 (52), an Ni film 61 (62) and an Au film 71 (72).

The soldering paste 81 (82) according to the present invention was applied onto each land at the component mounting board 1 (see FIG. 4a). The soldering paste 81 (82) was applied through a printing process implemented by using a metal mask having a 100 μm thickness. The dimensions of the opening at the metal mask were set to 0.5 mm×0.3 mm to match the dimensions of the lands on which an electronic component 4 was to be mounted.

Then, the electronic component 4 which was 1 mm in length and 0.5 mm in width was mounted onto the soldering paste 81 (82) (see FIG. 4b), and the assembly was processed in a reflow furnace to solder the electronic component 4 onto the component mounting board 1 (see FIG. 4c). Through the process described above, an electronic component device according to the present invention was obtained.

Subsequently, the shear strength of the electronic component device was measured through the method illustrated in FIG. 2. In FIG. 4c, reference numeral 3 indicates the flux according to the present invention having been contained in the soldering paste 81 (82) and then formed fillets on the outer sides of the terminal electrodes 41 and 42.

COMPARISON EXAMPLE 2

For purposes of comparison, a soldering paste containing a rosin flux was used to solder a chip component onto a component mounting board as in the related art. The quantity of the rosin flux mixed to constitute the soldering paste relative to the quantity of soldering powder was set at 10 wt %.

Figure 5A:
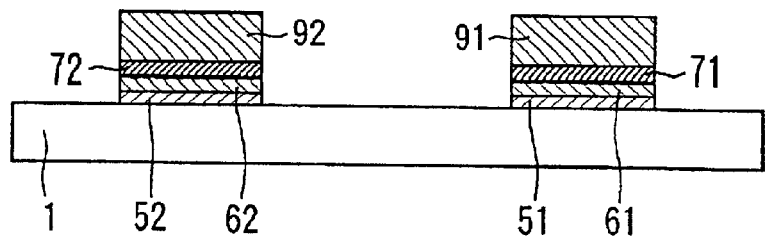
FIG. 5 presents partial cross-sectional views illustrating the component mounting board in detail and the soldering process implemented to solder a chip component onto the component mounting board by using a soldering paste containing a rosin flux in the prior art.
Figure 5B:
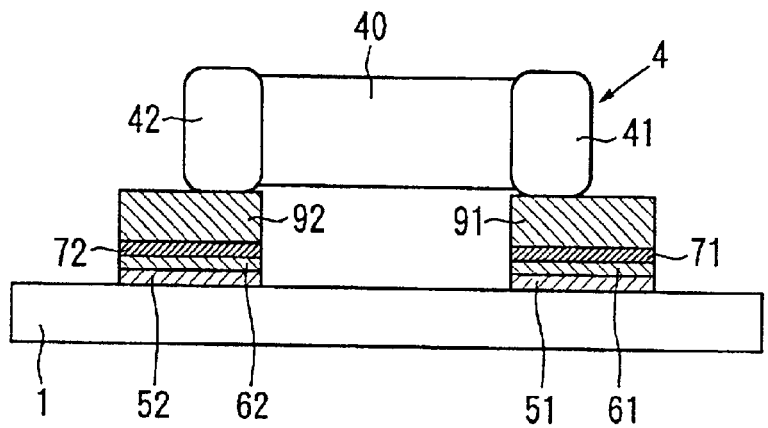
Figure 5C:
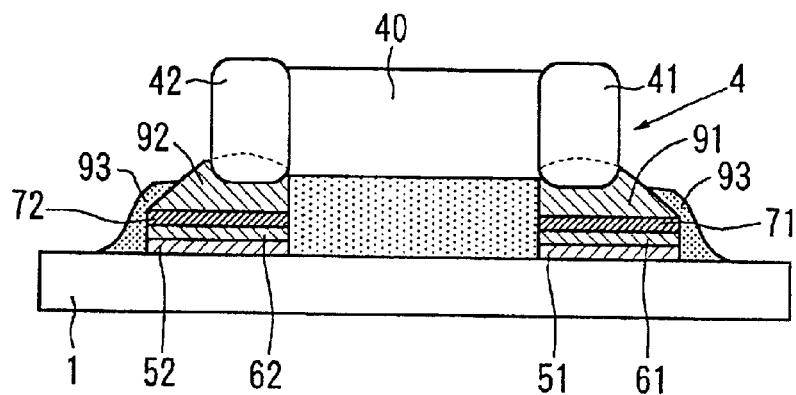

FIGS. 5a through 5c present partial cross-sectional views showing the component mounting board in detail and the soldering process through which the chip component was soldered onto the component mounting board. As shown in the figures, the component mounting board 1 included two lands formed by sequentially laminating a Cu film 51 (52), an Ni film 61 (62) and an Au film 71 (72). The soldering paste 91 (92) containing the rosin flux was applied onto the lands at the component mounting board 1 (see FIG. 5a).

Then, an electronic component 4 that was 1 mm in length and 0.5 mm in width was mounted onto the soldering paste 91 (92) containing the rosin flux (see FIG. 5b), and the assembly was processed in a reflow furnace to solder the electronic component 4 onto the component mounting board 1 (see FIG. 5c). Subsequently, the shear strength of the electronic component device was measured through the method illustrated in FIG. 2.

Figure 6:
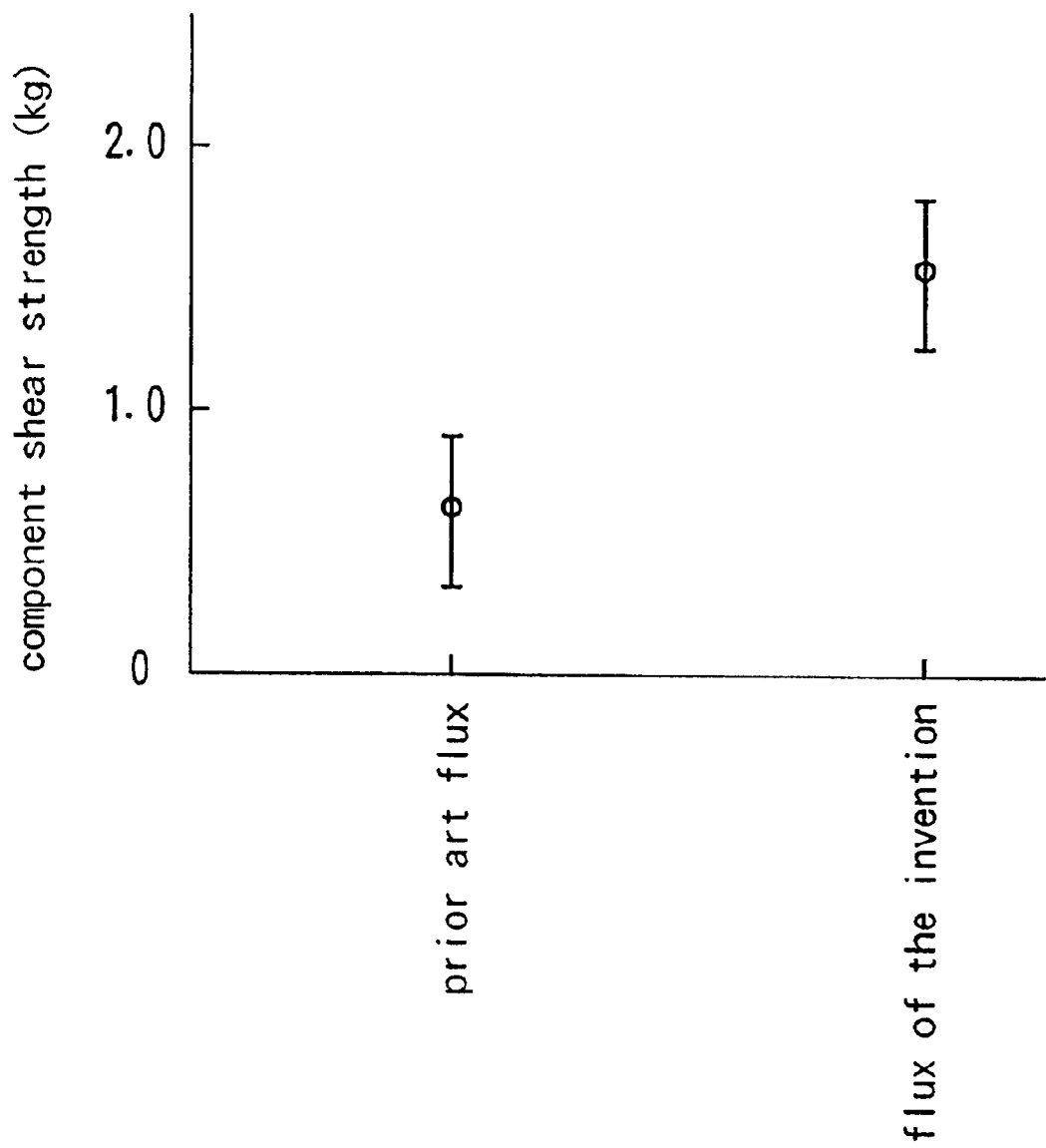
FIG. 6 presents the results of component shear strength tests conducted in conjunction with the soldering method according to the present invention illustrated in FIG. 4 and the soldering method in the prior art illustrated in FIG. 5.

FIG. 6 presents the results of the component shear strength test conducted on embodiment 2 and comparison example 2. As shown in the figure, while the shear strength average achieved in comparison example 2 was approximately 600 g, an approximate average strength of 1500 g was achieved in embodiment 2.

EMBODIMENT 3

A soldering paste was prepared by mixing the flux prepared in embodiment 1 with soldering powder. The quantity of the flux that was mixed relative to the quantity of the soldering powder was increased to 20 to 45 wt %.

Figure 7A:
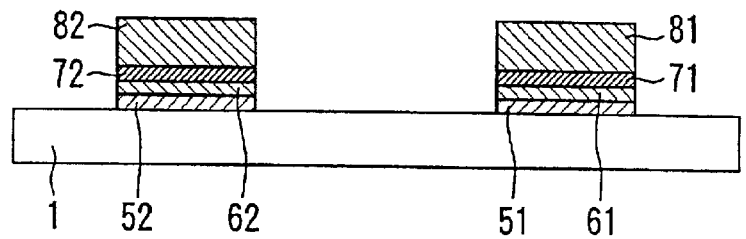
FIG. 7 presents partial cross-sectional views illustrating a soldering method achieved by utilizing a soldering paste containing the flux according to the present invention.
Figure 7B:
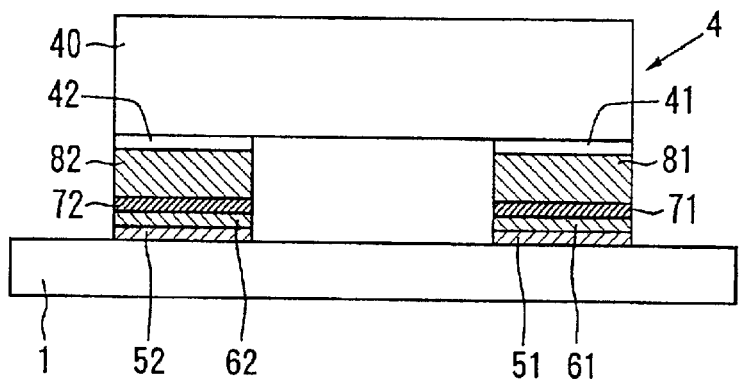

An electronic component 4 was soldered onto a component mounting board 1 using this soldering paste as illustrated in FIG. 7. To explain in more specific terms in reference to FIG. 7, the component mounting board 1 included two lands formed by sequentially laminating a Cu film 51 (52), an Ni film 61 (62) and an Au film 71 (72) (see FIG. 7a).

The soldering paste 81 (82) according to the present invention was applied onto each land at the component mounting board 1 (see FIG. 7a). The soldering paste 81 (82) was applied through a printing process implemented by using a metal mask having a 100 μm thickness. The dimensions of the opening at the metal mask were set to 0.5 mm×0.3 mm to match the dimensions of the lands on which the electronic component 4 was to be mounted.

Figure 7C:
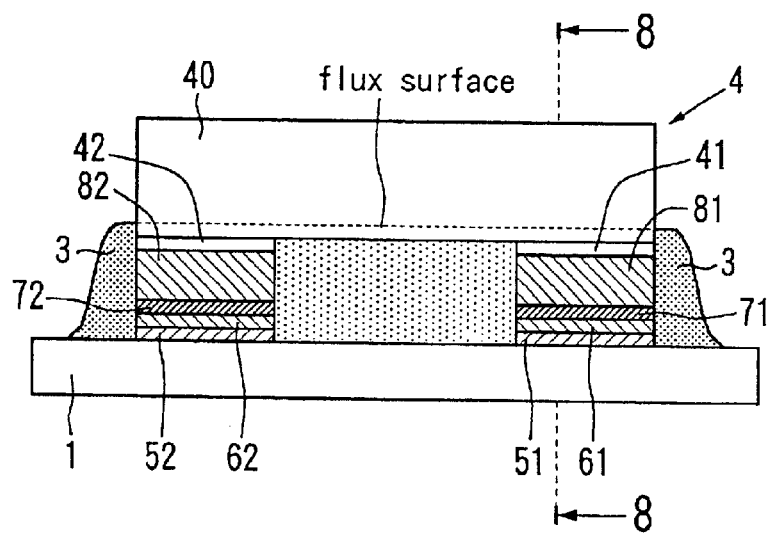

Then, the electronic component 4 that was 1 mm in length and 0.5 mm in width was mounted onto the soldering paste 81 (82) (see FIG. 7b), and the assembly was processed in a reflow furnace to solder the electronic component 4 onto the component mounting board 1 (see FIG. 7c). Through the process described above, an electronic component device according to the present invention was obtained.

Figure 8:
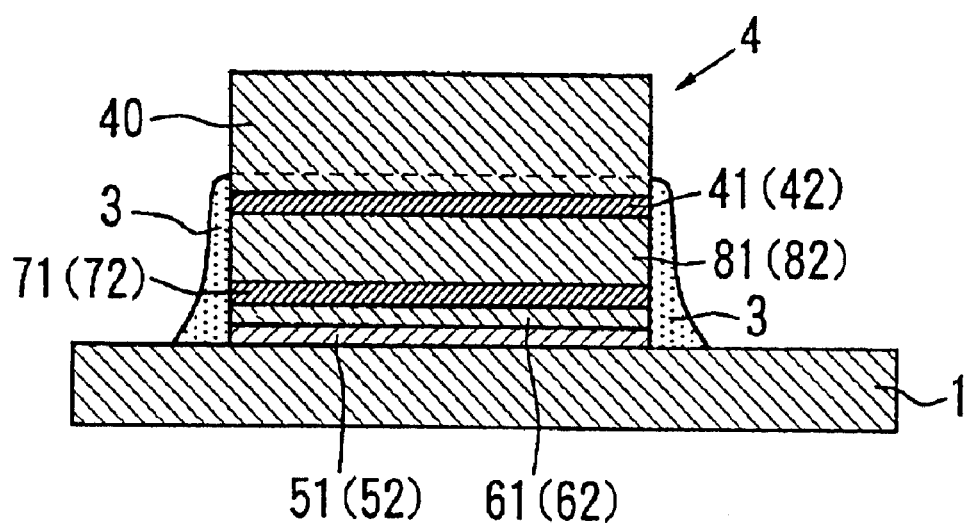
FIG. 8 presents a cross-sectional view taken along line 8—8 in FIG. 7.

The electronic component device having undergone the soldering process is shown in FIG. 8. FIG. 8 is a cross-sectional view taken along line 8—8 in FIG. 7c. While the soldering paste in embodiment 3 contained the flux whose content was increased on purpose, the overall quantity of the solder that was actually used was reduced, and the electronic component 4 was soldered in a desirable state without becoming tilted, as shown in FIG. 8. In FIG. 7c, reference numeral 3 indicates the flux according to the present invention having been contained in the soldering paste 81 (82) that formed fillets on the outer sides of the terminal electrodes 41 and 42.

In addition, the use of the soldering paste containing the flux according to the present invention results in the periphery of the soldered electronic component 4 becoming covered by the flux improving the component shear strength. By increasing the flux content in the soldering paste on purpose in this manner, it becomes possible to control the solder thickness with the soldering paste. In particular, it was possible to prevent the electronic component 4 from being soldered in a misaligned state and to achieve a degree of bonding strength equal to or greater than that achieved in an electronic component in the prior art when the flux content was set to 35 wt % or higher.

COMPARISON EXAMPLE 3

Figure 9A:
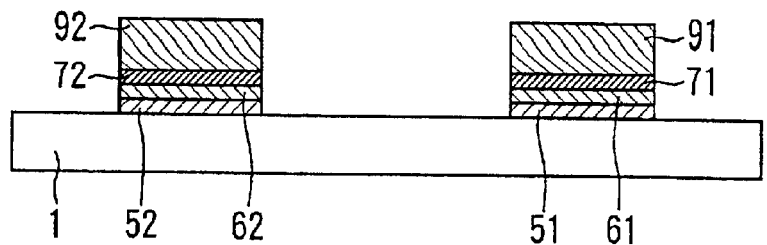
FIG. 9 presents partial cross-sectional views of a soldering method achieved by using a soldering paste containing a rosin flux in the prior art.
Figure 9B:
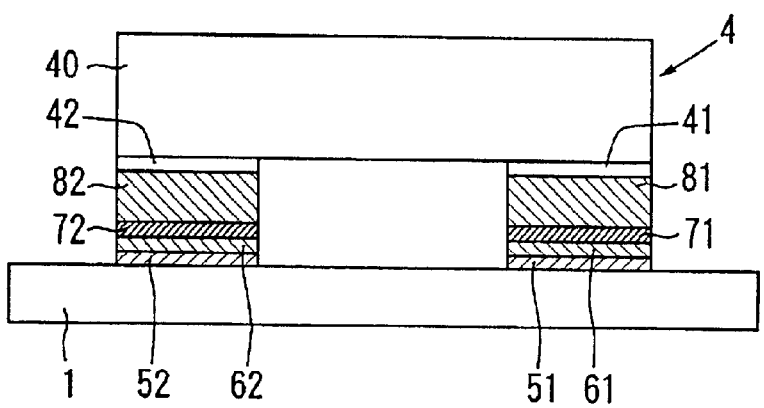

For purposes of comparison, an electronic component 4 was mounted and soldered onto a component mounting board 1 using a soldering paste containing a rosin flux, as shown in FIG. 9, as in the prior art. To explain in more specific terms in reference to FIG. 9, the component mounting board 1 included two lands formed by sequentially laminating a Cu film 51 (52), an Ni film 61 (62) and an Au film 71 (72) (see FIG. 9a).

The soldering paste 91 (92) containing a rosin flux was applied onto each land at the component mounting board 1 (see FIG. 9a). The soldering paste 91 (92) was applied through a printing process implemented by using a metal mask having a 100 μm thickness. The dimensions of the opening at the metal mask were set to 0.5 mm×0.3 mm to match the dimensions of the lands on which the electronic component 4 was to be mounted.

Figure 9C:
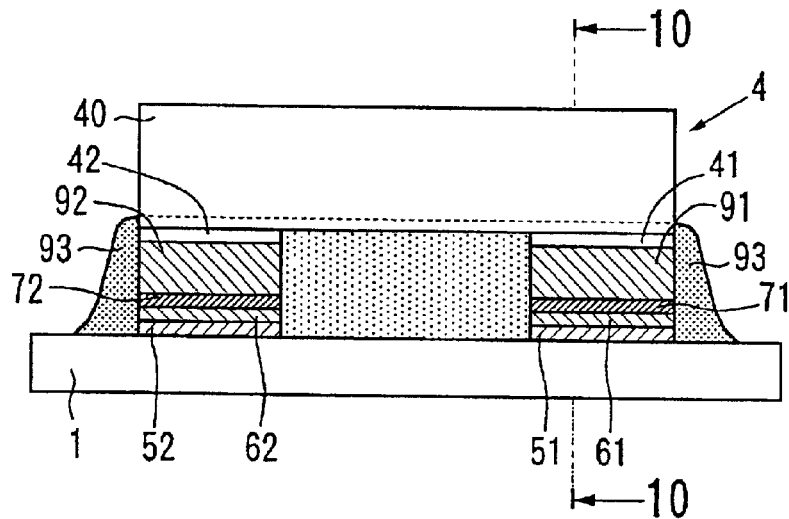

Then, the electronic component 4 that was 1 mm in length and 0.5 mm in width was mounted onto the soldering paste 91 (92) (see FIG. 9b), and the assembly was processed in a reflow furnace to solder the electronic component 4 onto the component mounting board 1 (see FIG. 9c).

Figure 10:
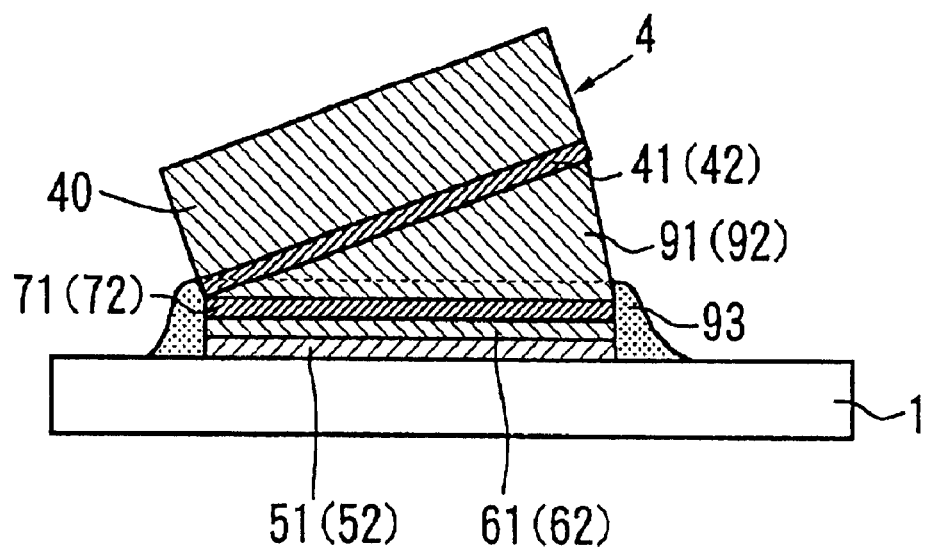
FIG. 10 presents a partial cross-sectional view taken along line 10—10 in FIG. 9.

The electronic component device having undergone the reflow soldering process is shown in FIG. 10. FIG. 10 is a partial cross-sectional view taken along line 10—10 in FIG. 9c. As illustrated in FIG. 10, an excessive quantity of solder was used in the soldering process implemented with the soldering paste containing the rosin flux in the prior art, causing the electronic component 4 to be soldered in a misaligned state. In FIG. 9c and FIG. 10, reference numeral 93 indicates the rosin flux having been contained in the soldering paste 91 (92).

EMBODIMENT 4

Desirable compositions that could be adopted in the flux were examined. A liquid epoxy resin was used as the adhesive resin and abietic acid (carboxylic acid) was used as the hardening agent. The abietic acid was mixed at the weight ratios shown in TABLE I relative to the weight of the liquid epoxy resin. These flux samples were applied onto boards, the boards were then processed in a reflow furnace the temperature which was set to 230° C. and the resulting hardened resin films were examined.

TABLE I

|  |  | mixing ratio (wt %) | | | | |
|---|---|---|---|---|---|---|
| mixed substance | liquid epoxy resin | 1 | 1 | 1 | 1 | 1 |
|  | abietic acid | 0.25 | 0.5 | 0.75 | 1 | 1.5 |
|  | solvent | 10 | 10 | 10 | 10 | 10 |
| hardened film physical property |  | not hardened | gelled | hardened elastic | hardened hard | gelled |
| hardened film hardness |  |  |  |  |  |  |

As shown in TABLE I, when the mixing ratio of the abietic acid (wt %) to the liquid epoxy resin (wt %) was 1, a hardened film achieving a high degree of hardness was formed to achieve the best results. Any of the other mixing ratio settings in the table resulted in a failure to harden, a gel film or an elastic hardened film and is thus not appropriate. A desired hardened film (bondability) may be obtained at an arbitrary reflow temperature by adjusting the mixing ratio of the epoxy resin or varying the quantity of the epoxy resin molecules and the number of functional groups and also by selecting the correct type of hardening agent (carboxylic acid) accordingly.

EMBODIMENT 5

The flux prepared in embodiment 4 and solder powder were mixed to prepare a soldering paste. The soldering powder contained Sn (96.5) and Ag (3.5). The flux content was set at 25 wt %. This soldering paste constitutes embodiment 5.

Figure 11:
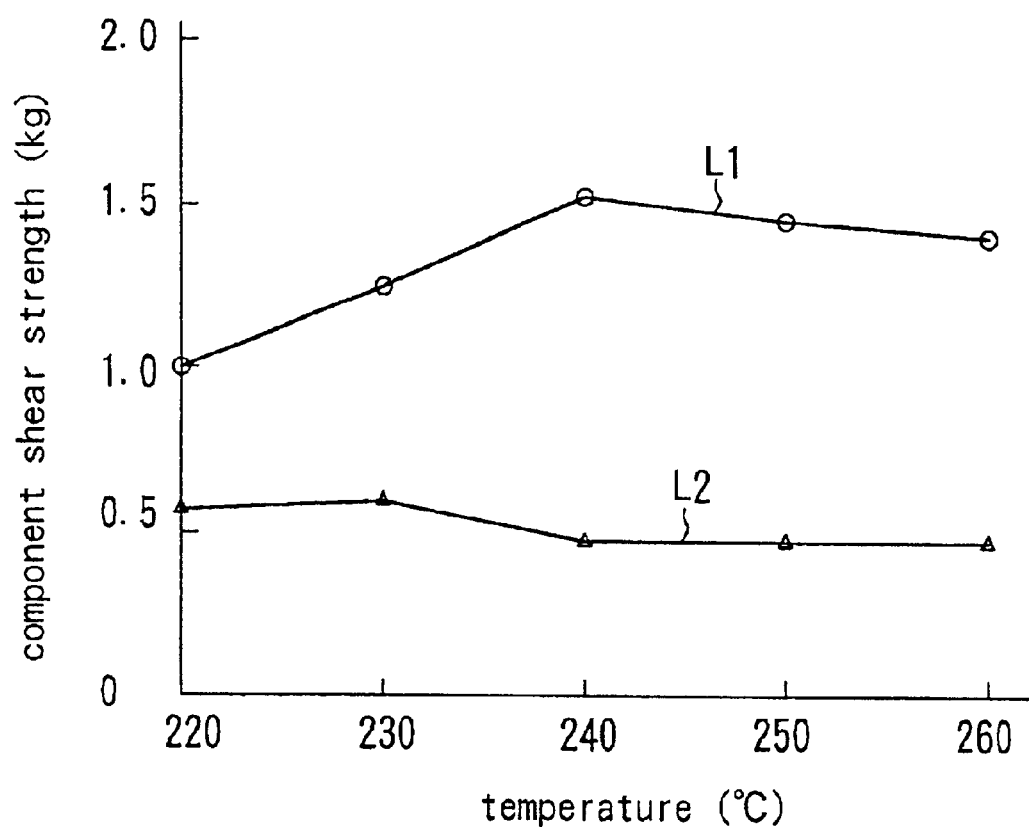
FIG. 11 shows the relationship between the reflow temperature and the component shear strength achieved by soldering a chip component with the soldering paste according to the present invention and the equivalent relationship achieved by soldering a chip component with a soldering paste containing a rosin flux in the prior art.

FIG. 11 shows the relationship between the reflow temperature and the component shear strength achieved by soldering a chip component with the soldering paste in embodiment 5 and the corresponding relationship achieved by soldering a chip component with a rosin soldering paste, used in the related art. In the figure, the curve L1 represents the characteristics achieved by using the soldering paste in embodiment 5 and the curve L2 represents the characteristics achieved by using the rosin soldering paste in the prior art.

As shown in FIG. 11, the soldering paste containing the flux demonstrates a higher degree of bonding strength compared to the rosin soldering paste in the prior art over a 220 to 260° C. reflow temperature range. A particularly high degree of bonding strength is assured when the reflow temperature is set to 230° C. or higher.

EMBODIMENT 6

The soldering paste in embodiment 5 was used to solder a chip component onto a component mounting board, thereby obtaining an electronic component device according to the present invention. An examination of the bondability between the component mounting board and terminal electrodes of the chip component conducted subsequently indicated that the soldering paste containing the flux achieves bondability similar to that of the rosin soldering paste. It is to be noted that when an evaluation similar to that made on the flux-containing soldering paste was performed on a conductive adhesive and an anisotropic conductive paste used in the prior art, it was confirmed that the component mounting board and the terminal of the component could not be bonded to each other.

While the electronic component 4 is mounted onto one surface of the component mounting board 1 in the embodiment described above, electronic components 4 may be mounted on the two surfaces of the component mounting board 1. In such a case, after executing a soldering process using the soldering paste according to the present invention at one surface of the component mounting board 1, an electronic component 4 may be soldered onto the other surface of the component mounting board 1 with a solder other than the soldering paste according to the present invention, e.g., a rosin soldering paste used in the prior art. Alternatively, the electronic components 4 may be soldered onto both surfaces of the component mounting board 1 with the soldering paste according to the present invention. In either case, problems such as the electronic component 4 becoming shifted, the Manhattan phenomenon (the raised component phenomenon) and the electronic component 4 falling off do not occur.

2. Application in Electronic Circuit Modules

The electronic circuit module according to the present invention does not have any substantial difference from the electronic component device explained earlier except that the electronic component is replaced by a semiconductor chip and that the component mounting board is replaced by a chip mounting board in the electronic circuit module. In other words, the basic structure assumed in the electronic circuit module according to the present invention is essentially the structure disclosed with regard to the electronic component device. No specific restrictions are imposed with regard to the semiconductor chip used in the electronic circuit module. A semiconductor chip normally includes a semiconductor element (not shown) or a passive circuit element. It goes without saying that the present invention may be adopted in an electronic circuit module referred to as a chip-size package (CSP) as well.

Figure 12:
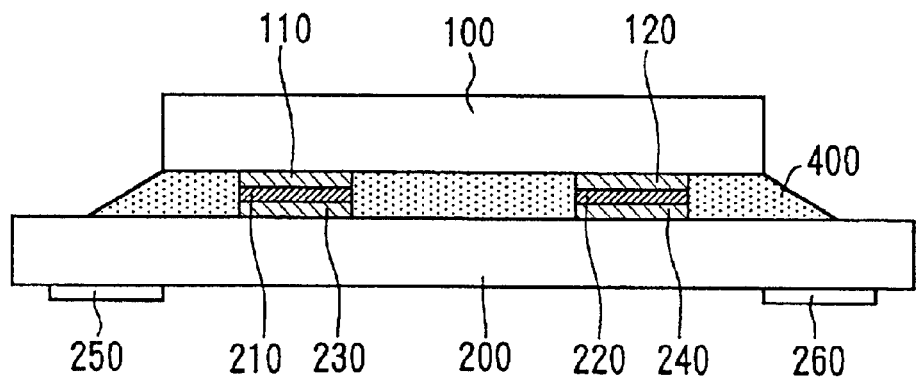
FIG. 12 presents a partial cross-sectional view of the electronic circuit module according to the present invention.

FIG. 12 presents a partial cross-sectional view of the electronic circuit module according to the present invention. The electronic circuit module in the figure includes a semiconductor chip 100, a chip mounting board 200 and a soldering flux 400. At the semiconductor chip 100 in the figure, an appropriate number of terminal electrodes 110 and 120 are formed at appropriate positions at the lower surface or the like, and these terminal electrodes 110 and 120 are bonded to lands 230 and 240 on the chip mounting board 200 with solders 210 and 220 respectively.

The chip mounting board 200 may be constituted of a ceramic substrate, an organic resin substrate or through a combination thereof. Inside the chip mounting board 200, a single conductor pattern layer or a plurality of conductor pattern layers, via holes provided along the thicknesswise direction and the like are formed under normal circumstances. A conductor pattern may be provided to constitute a capacitor, an inductor or the like as well as simply to facilitate circuit wiring.

The soldering flux 400 that contains an adhesive resin and a hardening agent is present between the semiconductor chip 100 and the chip mounting board 200 to bond them to each other. The soldering flux 400 is used as an adhesive.

In the embodiment shown in the figure, the soldering flux 400 fills the gap between the semiconductor chip 100 and the chip mounting board 200 almost completely.

As explained earlier, the soldering flux 400 does not need to be washed and can be directly utilized as an adhesive. As a result, an electronic circuit module can be manufactured at low production cost without having to implement a flux washing process. In addition, since the soldering flux that contains the adhesive resin and the hardening agent functions as an adhesive, a highly reliable electronic circuit module achieving a far greater durability in the solder joints is obtained.

Figure 13:
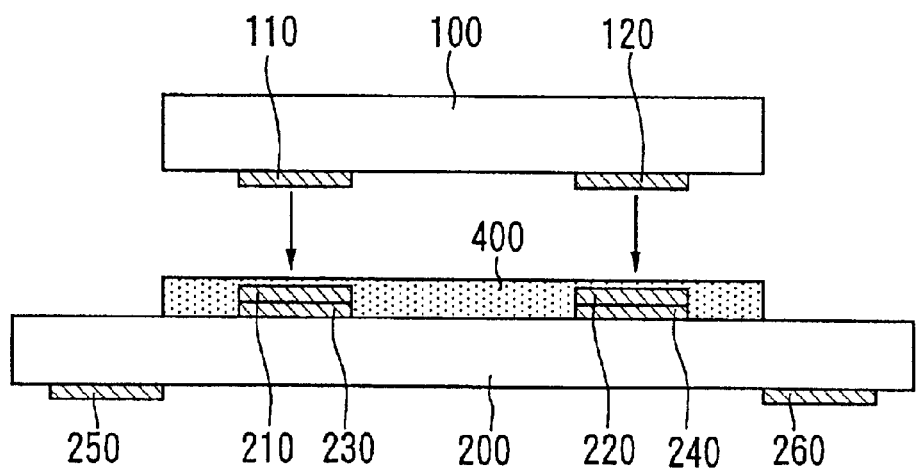
FIG. 13 presents a partial cross-sectional view illustrating the soldering method adopted in the electronic circuit module shown in FIG. 12.

FIG. 13 illustrates the soldering method adopted in an electronic circuit module such as the CSP (chip-size package) shown in FIG. 12. This soldering method is achieved by adopting the soldering method illustrated in FIG. 1 in conjunction with an electronic circuit module. As explained earlier, the flux 400 containing the adhesive resin and the hardening agent is applied onto the chip mounting board 200 at that the solder bumps 210 and 220 have been formed in advance. The solder bumps 210 and 220 are formed on lands 230 and 240 provided at the surface of the chip mounting board 200. The details of the soldering flux 400 have already been explained.

Then, the semiconductor chip 100 is mounted onto the chip mounting board 200. The semiconductor chip 100 is set on the chip mounting board 200 so as to position the terminal electrodes 110 and 120 on the solder bumps 210 and 220. Subsequently, the chip mounting board 200 having the semiconductor chip 100 mounted thereupon is processed in a reflow furnace to bond the terminal electrodes 110 and 120 provided at the two ends of a base body 40 of the semiconductor chip 100 to the solder bumps 210 and 220 through soldering. Through this process, the electronic circuit module shown in FIG. 12 is obtained.

FI G. 14 is a partial cross-sectional view of another example of the electronic circuit module according to the present invention. In the figure, the same reference numerals are assigned to parts identical to those shown in FIG. 12. In the embodiment presented in FIG. 14, the soldering flux 400 that is present between the semiconductor chip 100 and the chip mounting board 200 bonds them together around the solder bumps 210 and 220.

In this case, too, the soldering flux 400 does not need to be washed and can be directly utilized as an adhesive. As a result, an electronic circuit module can be manufactured at low production cost without having to implement a flux washing process. In addition, since the soldering flux that contains the adhesive resin and the hardening agent functions as an adhesive, a highly reliable electronic circuit module achieving a far greater durability in the solder joints is obtained.

Figure 14:
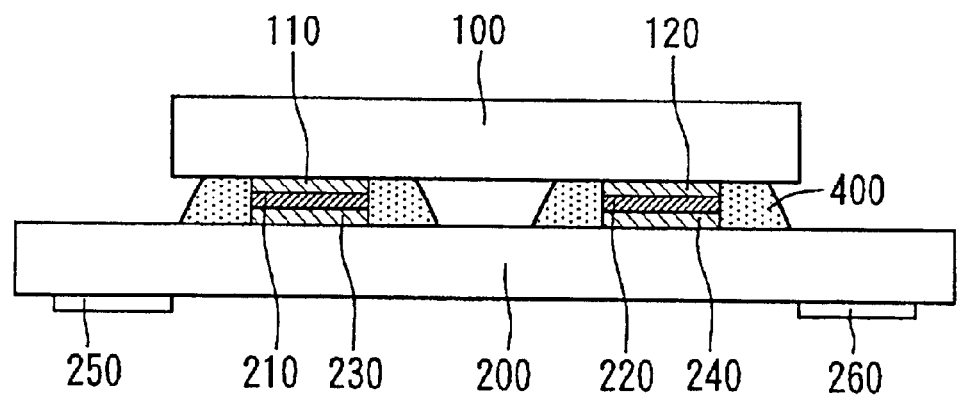
FIG. 14 presents a partial cross-sectional view of another example of the electronic circuit module according to the present invention.
Figure 15:
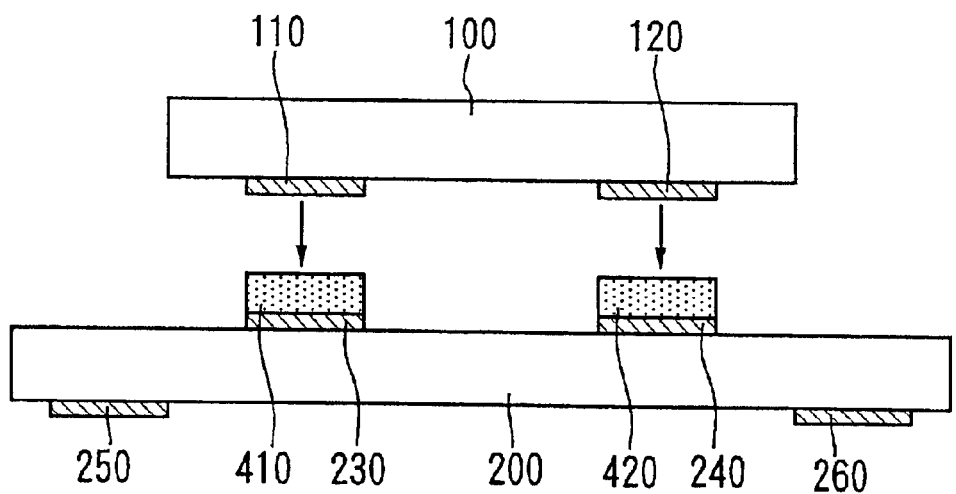
FIG. 15 presents a partial cross-sectional view illustrating the soldering method adopted in the electronic circuit module shown in FIG. 14.

FIG. 15 illustrates the soldering method adopted in the electronic circuit module shown in FIG. 14. This soldering method is achieved by adopting the soldering method shown in FIGS. 4, 5, 7 and 8 in conjunction with an electronic circuit module. The flux 410 and 420 containing the soldering powder achieving the composition described earlier is applied onto the lands 230 and 240 formed in advance at the surface of the chip mounting board 200.

Then, the semiconductor chip 100 is mounted on the chip mounting board 200. The semiconductor chip 100 is set on the chip mounting board 200 so as to position the terminal electrodes 110 and 120 on the flux 410 and 420 containing the soldering powder. The chip mounting board 200 having the semiconductor chip 100 mounted thereupon is processed in a reflow furnace to bond the terminal electrodes 110 and 120 provided at the two ends of the semiconductor chip 100 through soldering by using the solder element included in the flux 410 and 420 containing the soldering powder.

In a bonded state, the adhesive resin and the hardening agent included in the flux 410 and 420 containing the soldering powder are present between the semiconductor chip 100 and the chip mounting board 200 to bond them together around the solder bumps 210 and 220. Through the process described above, the electronic circuit module shown in FIG. 14 is obtained. By increasing the quantities of the flux 410 and 420 containing the soldering powder used in the method illustrated in FIG. 15, the soldering flux 400 can be made to fill the gap between the semiconductor chip 100 and the chip mounting board 200 almost completely as shown in FIG. 12. Next, an explanation is given in reference to a specific embodiment and comparison example.

EMBODIMENT 7

First, a soldering paste containing a thermo-setting flux achieving the following composition was prepared.

Flux: obtained by mixing bisphenol A resin and phthalic anhydride at a mass ratio of 1:1 and then adding a solvent at 10 mass %

Soldering powder: Sn-3.5 Ag

The flux was added into the soldering powder at a rate of 10 mass %. The composition of the soldering powder can be selected in correspondence to the reflow temperature, and thus, another type of composition may be adopted. In addition, the quantity of the flux to be added, too, can be freely set.

The soldering paste containing the thermo-setting flux described above was applied onto an organic chip mounting board through screen printing. A screen with a metal mask thickness of 100 μm was used in the screen printing process.

Next, a semiconductor chip having solder bumps formed thereupon in advance was mounted on the organic chip mounting board and the organic chip mounting board was then processed in a reflow furnace. The maximum reflow temperature during the furnace process was set to 240° C. and the length of time over which the process was performed at 220° C. or higher was set to 30 seconds.

COMPARISON EXAMPLE 7

For purposes of comparison, products of the known art were prepared by using a sealant and also without using a sealant.

(Tests)

The electronic circuit module achieved in embodiment 7 and the two types of electronic circuit modules in the related art underwent thermal shock tests. The thermal shock tests were each conducted over 2000 cycles, with the temperature sustained at −55° C. over 0.5 hours and then sustained at +125° C. over 0.5 hours during each cycle. Then, the DC resistances (RDCs) at the soldered connector portions were measured.

Figure 16:
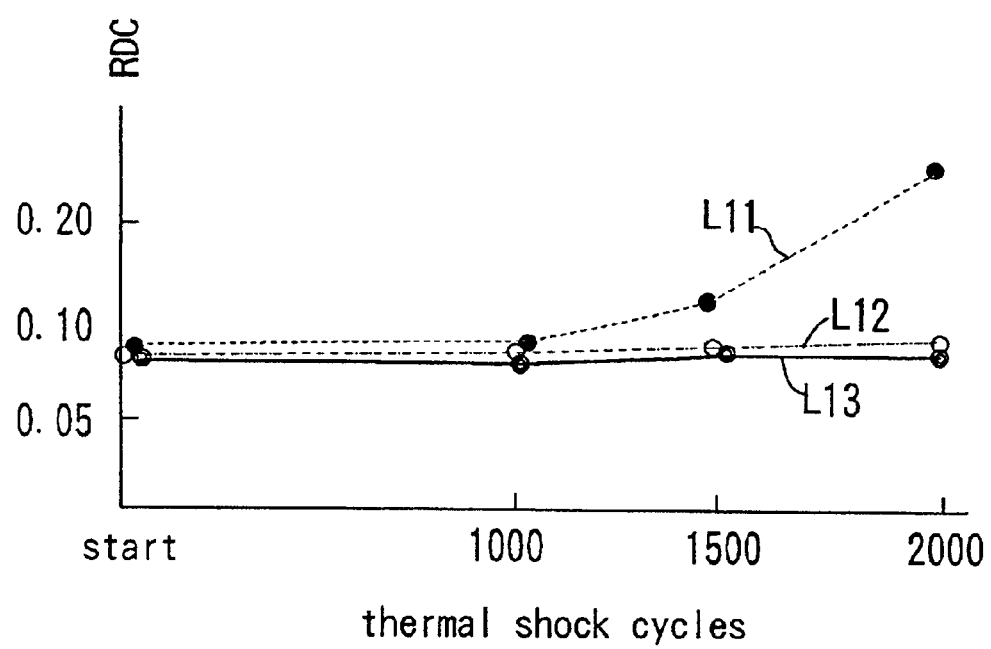
FIG. 16 is a graph of the results of RDC measurement.

FIG. 16 presents a graph of the results of the RDC measurement. In FIG. 16, the horizontal axis represents the number of thermal shock cycles and the vertical axis represents the RDC. The characteristics L11 were achieved by the prior art product prepared without using a sealant, the characteristics L12 were achieved by the prior art product prepared by using a sealant and the characteristics L13 were achieved by embodiment 7 of the present invention.

As the characteristics L11 in FIG. 16 indicate, the RDC increased drastically in the prior art product prepared without using a sealant once the number of cycles in the thermal shock test exceeded 1500, manifesting a deterioration in the RDC. No such deterioration in the RDC was observed in embodiment 7 according to the present invention even after the number of cycles exceeded 2000, as indicated by the characteristics L13. These characteristics L13 are equivalent to the characteristics L12 achieved in the prior art product by using a sealant.

3. Application in Electronic Circuit Apparatuses

The electronic circuit apparatus according to the present invention does not have any substantial difference from the electronic component device explained earlier except that the electronic component is replaced by an electronic circuit module and that the component mounting board is replaced by a motherboard in the electronic circuit apparatus. In other words, the basic structure assumed in the electronic circuit apparatus according to the present invention is essentially the structure disclosed in reference to the electronic component device.

Figure 17:
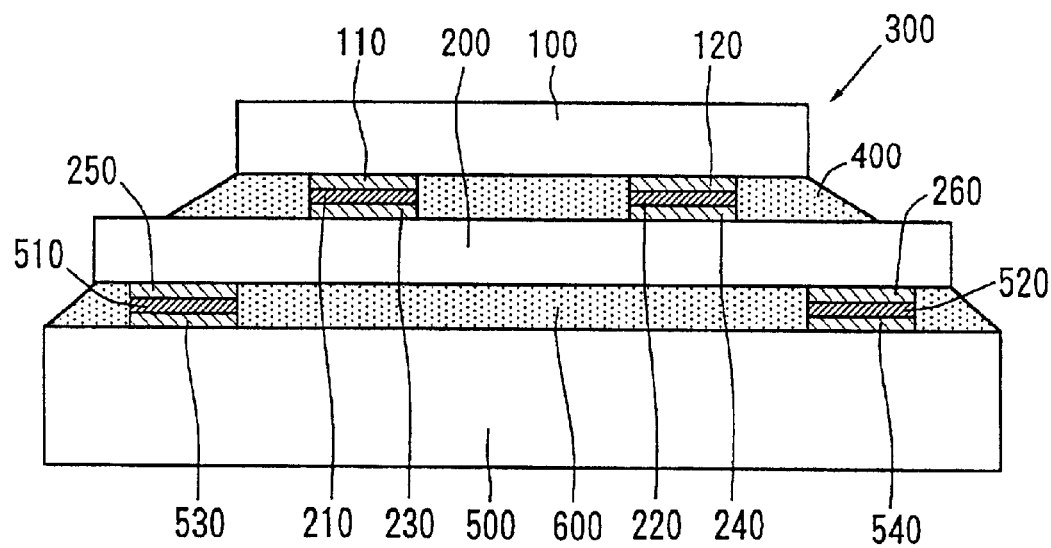
FIG. 17 presents a partial cross-sectional view of the electronic circuit apparatus according to the present invention.

FIG. 17 presents a partial cross-sectional view of the electronic circuit apparatus according to the present invention. The electronic circuit apparatus in the figure includes an electronic circuit module 300, a motherboard 500 and a soldering flux 600.

While the electronic circuit module 300 may be an electronic circuit module of the existing art, it is desirable to utilize an electronic circuit module assuming the structure illustrated in FIG. 12 or 14. At the electronic circuit module 300, an appropriate number of terminal electrodes 250 and 260 are formed at appropriate positions at the lower surface thereof for instance, and these terminal electrodes 250 and 260 are bonded to lands 530 and 540 on the motherboard 500 with solder bumps 510 and 520 respectively.

The motherboard 500 may be constituted of a ceramic substrate, an organic resin substrate or through a combination thereof. Inside the motherboard 500, a single conductor pattern layer or a plurality of conductor pattern layers, via holes provided along the thicknesswise direction and the like may be formed. A conductor pattern is provided to constitute a capacitor, an inductor or the like or simply to facilitate circuit wiring.

The soldering flux 600 that contains an adhesive resin and a hardening agent, is present between the electronic circuit module 300 and the motherboard 500 to bond them to each other. The soldering flux 600 is used as an adhesive. In the embodiment shown in the figure, the soldering flux 600 fills the gap between the electronic circuit module 300 and the motherboard 500 almost completely.

The soldering flux 600 does not need to be washed and can be directly utilized as an adhesive. As a result, an electronic circuit apparatus can be manufactured at low production cost without having to implement a flux washing process. In addition, since the soldering flux that contains the adhesive resin and the hardening agent functions as an adhesive, a highly reliable electronic circuit apparatus achieving a far greater durability in the solder joints is obtained.

Figure 18:
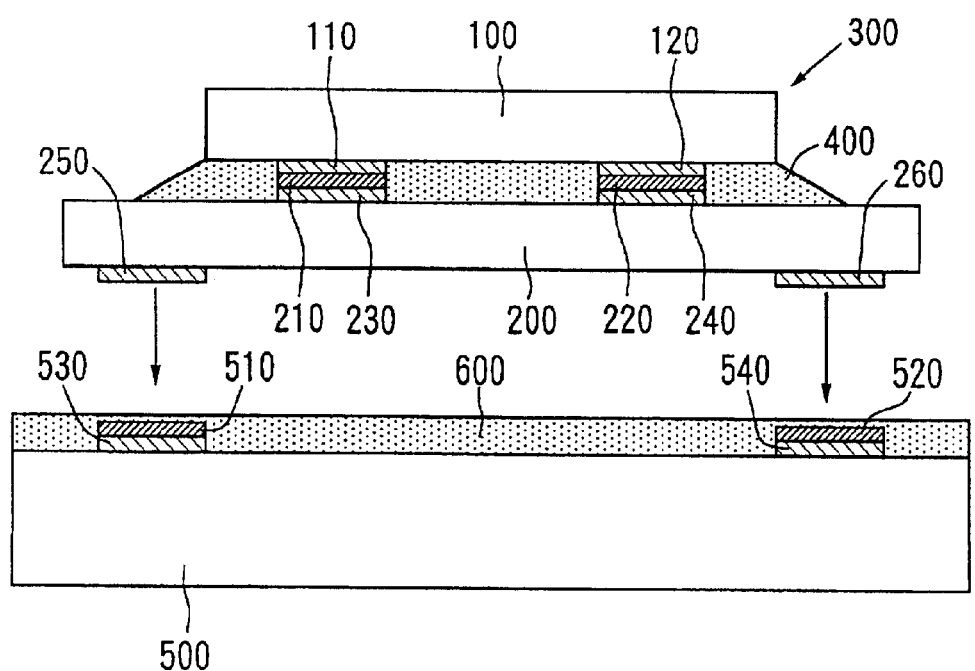
FIG. 18 presents a partial cross-sectional view illustrating the soldering method adopted in the electronic circuit apparatus shown in FIG. 17.

FIG. 18 illustrates the soldering method adopted in the electronic circuit apparatus shown in FIG. 17. This soldering method is achieved by adopting the soldering method illustrated in FIG. 1 in conjunction with an electronic circuit apparatus. As explained earlier, the flux 600 containing the adhesive resin and the hardening agent is applied onto the motherboard 500 at which the solder bumps 510 and 520 have been formed in advance. The flux 600 does not contain any soldering powder.

The solder bumps 510 and 520 are formed on the lands 530 and 540 provided at a surface of the motherboard 500. Then, the electronic circuit module 300 is mounted onto the motherboard 500. The electronic circuit module 300 is set on the motherboard 500 so as to position the terminal electrodes 250 and 260 on the solder bumps 510 and 520. Subsequently, the motherboard 500 having the electronic circuit module 300 mounted thereupon is processed in a reflow furnace to bond the terminal electrodes 250 and 260 provided at the electronic circuit module 300 to the solder bumps 510 and 520 through soldering. Through this process, the electronic circuit apparatus shown in FIG. 17 is obtained.

Figure 19:
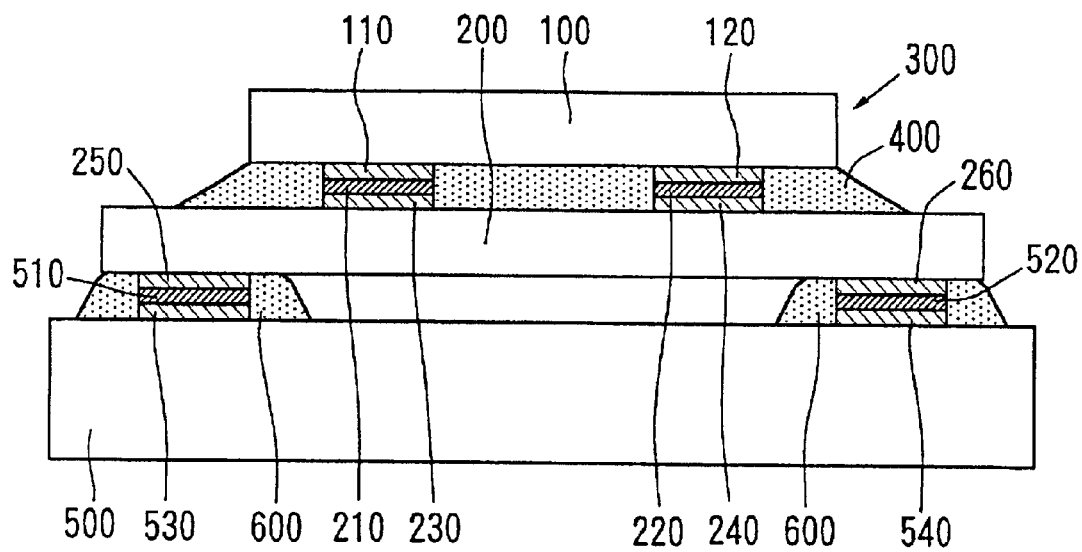
FIG. 19 presents a partial cross-sectional view of another example of the electronic circuit apparatus according to the present invention.

FIG. 19 is a partial cross-sectional view of another example of the electronic circuit apparatus according to the present invention. In the figure, the same reference numerals are assigned to parts identical to those shown in FIG. 17. In the embodiment presented in FIG. 19, the soldering flux 600 that is present between the electronic circuit module 300 and the motherboard 500 bonds them together around the solder bumps 510 and 520.

In this case, too, the soldering flux 600 does not need to be washed and can be directly utilized as an adhesive. As a result, an electronic circuit apparatus can be manufactured at low production cost without having to implement a flux washing process. In addition, since the soldering flux 600 that contains the adhesive resin and the hardening agent in addition to the soldering powder, functions as an adhesive, a highly reliable electronic circuit apparatus achieving a far greater, durability in the solder joints is obtained.

Figure 20:
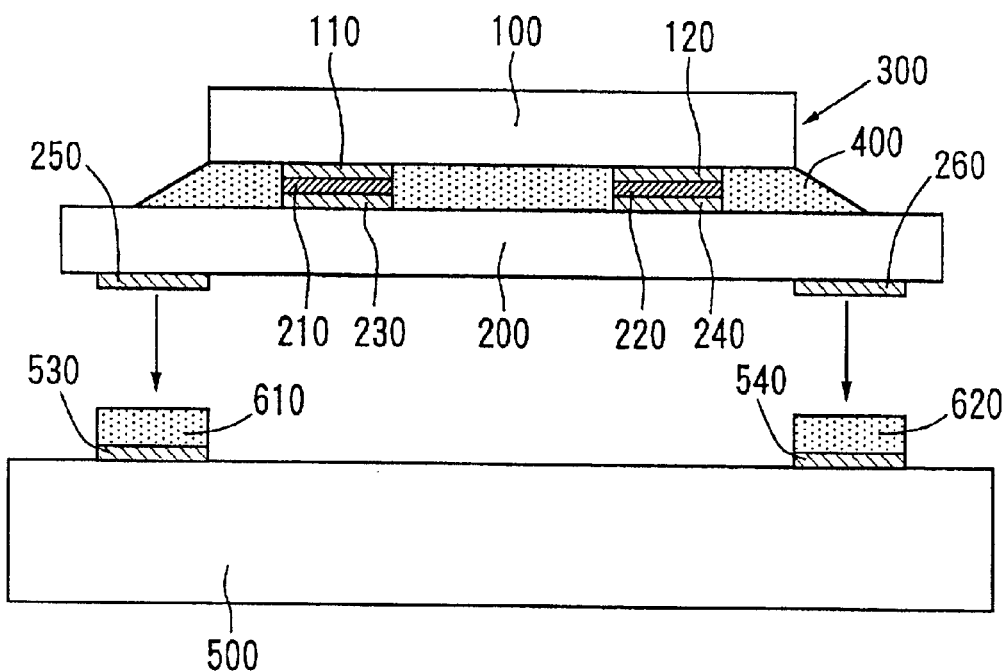
FIG. 20 presents a partial cross-sectional view illustrating the soldering method adopted in the electronic circuit apparatus shown in FIG. 19.

FIG. 20 illustrates the soldering method adopted in the electronic circuit apparatus shown in FIG. 19. This soldering method is achieved by adopting the soldering method shown in FIGS. 4 through 8 in conjunction with an electronic circuit apparatus. The flux 610 and 620 containing the soldering powder achieving the composition described earlier is applied onto the lands 530 and 540 formed in advance at the surface of the motherboard 500. Then, the electronic circuit module 300 is mounted on the motherboard 500. The electronic circuit module 300 is set on the motherboard 500 so as to position the terminal electrodes 250 and 260 on the flux 610 and 620 containing the soldering powder.

Next, the motherboard 500 having the electronic circuit module 300 mounted thereupon is processed in a reflow furnace to bond the terminal electrodes 250 and 260 provided at the electronic circuit module 300 through soldering by using the solder element included in the flux 610 and 620 containing the soldering powder. The adhesive resin and the hardening agent included in the flux 610 and 620 containing the soldering powder are present between the electronic circuit module 300 and the motherboard 500 to bond them together around the solder bumps 510 and 520. Through the process described above, the electronic circuit apparatus shown in FIG. 19 is obtained. By increasing the quantities of the flux 610 and 620 containing the soldering powder used in the method illustrated in FIG. 20, the soldering flux 600 can be made to fill the gap between the electronic circuit module 300 and the motherboard 500 almost completely as shown in FIG. 17. Next, an explanation is given in reference to specific embodiments and comparison examples.

EMBODIMENT 8

First, a soldering paste containing a thermo-setting flux achieving the following composition was prepared.

Flux: obtained by mixing bisphenol A resin and phthalic anhydride at a mass ratio of 1:1 and then adding a solvent at 10 mass %

Soldering Powder: Sn-3.5 Ag

The flux was added into the soldering powder at a rate of 10 mass %. The composition of the soldering powder can be selected in correspondence to the reflow temperature, and thus, another type of composition may be adopted. In addition, the quantity of the flux to be added, too, can be freely set.

The motherboard was constituted by using an organic motherboard. The electronic circuit module was constituted by mounting a semiconductor chip on an organic chip mounting board. The surfaces of the terminal electrodes provided at the lower surface of the organic chip mounting board were processed through an Au plating process so as to allow them to be soldered to the organic motherboard.

The soldering paste containing the thermo-setting flux described above was applied onto the organic chip mounting board through screen printing. A screen with a metal mask thickness of 100 $\mu$m was used in the screen printing process.

Next, the electronic circuit module was mounted on the organic motherboard and the organic motherboard was then processed in a reflow furnace. The maximum reflow temperature during the furnace process was set to 240° C. and the length of time over which the process was performed at 220° C. or higher was set to 30 seconds.

EMBODIMENT 9

An electronic circuit apparatus was manufactured by using a ceramic substrate to constitute the chip mounting board of the electronic circuit module, by following the procedure taken in embodiment 8.

COMPARISON EXAMPLE 8

An electronic circuit module having a chip mounting board constituted of an organic material was soldered to an organic motherboard with a flux of the related art. The surfaces of the terminal electrodes provided at the lower surface of the organic chip mounting board were processed through an Au plating process so as to allow them to be soldered to the organic motherboard.

COMPARISON EXAMPLE 9

An electronic circuit module having a chip mounting board constituted of a ceramic material was soldered to an organic motherboard with a flux of the related art. The surfaces of the terminal electrodes provided at the lower surface of the ceramic chip mounting board were processed through an Au plating process so as to allow them to be soldered to the organic motherboard.

(Tests)

The electronic circuit modules achieved in embodiments 8 and 9 and the two types of electronic circuit modules in the related art prepared in comparison examples 8 and 9 underwent thermal shock tests. The thermal shock tests were conducted over 2000 cycles, with the temperature sustained at −55° C. over 0.5 hours and then sustained at +125° C. over 0.5 hours during each cycle. Then, the DC resistances (RDCs) at the soldered connector portions were measured.

Figure 21:
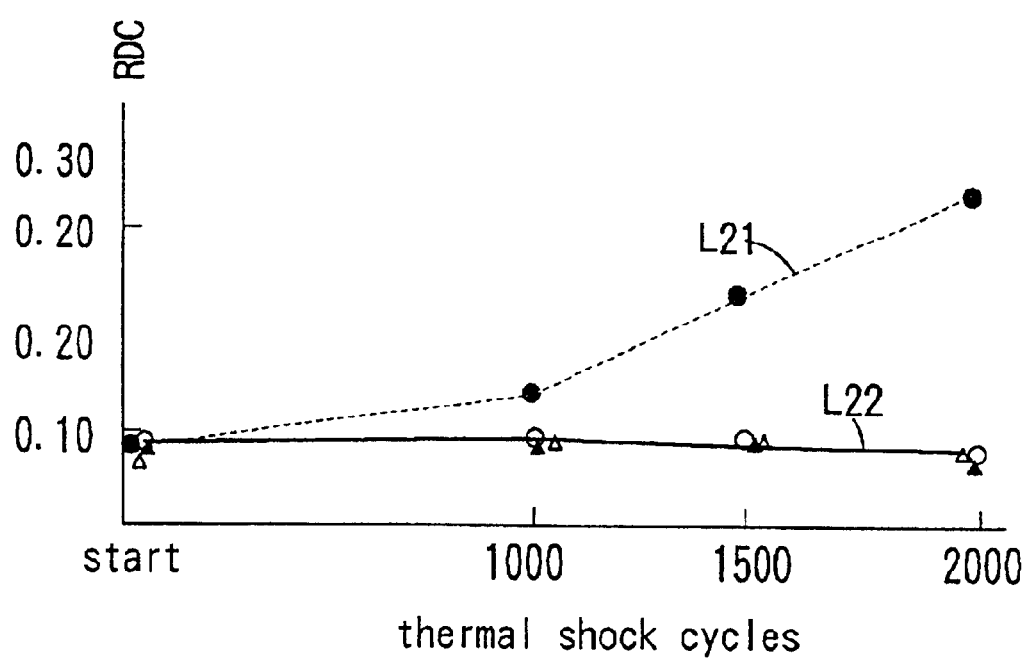
FIG. 21 is a graph of the results of RDC measurement.

FIG. 21 presents a graph of the results of the RDC measurement. In FIG. 21, the horizontal axis represents the number of thermal shock cycles and the vertical axis represents the RDC. The characteristics L21 were achieved in comparison example 9 and the characteristic L22 were achieved in embodiments 8 and 9 and comparison example 8.

In FIG. 21, the RDC measured in comparison example 9 with a ceramic material constituting the chip mounting board of the electronic circuit module and an organic material constituting the motherboard increased drastically, manifesting deterioration in the RDC once the number of test cycles exceeded 1000 as indicated by the characteristics L21. In contrast, embodiments 8 and 9 of the present invention did not manifest any deterioration in the RDC even when the number of test cycles exceeded 2000 cycles as indicated by the characteristics L22. It is a point of special interest to be noted that while a pronounced RDC deterioration results when an electronic circuit module in the prior art having a chip mounting board constituted of a ceramic substrate and a motherboard constituted of an organic resin substrate (see the characteristics L21) are used in combination, it is possible to prevent such an RDC deterioration even in the same substrate combination by adopting the present invention (see the characteristics L22) as the comparison of the characteristics L22 representing embodiment 9 and the characteristics L21 representing comparison example 9 clearly indicates.

As described earlier, an electronic component is bonded onto a component mounting board with the adhesive resin contained in the flux according to the present invention. Then, when the electronic component has been bonded to the component mounting board, the assembly undergoes an inspection process during which the soldering state is inspected. If the solder is defective, it is desirable to disengage the electronic component from the component mounting board to re-solder the electronic component onto the component mounting board. If the electronic component cannot be separated from the component mounting board, the electronic component and the component mounting board must be discarded, that leads to an increase in production cost and a reduction in yield. Accordingly, it is desirable to constitute the flux and the soldering paste according to the present invention so as to allow the soldered electronic component to be separated from the component mounting board.

In addition, the use of Pb-free solders has become common in recent years as part of the effort made to protect the global environment and solder elements achieving various compositions are used in such Pb-free solders. Since solder elements with different compositions have varying melting points, the reflow temperature must be adjusted in conformance to the composition of the solder element in use. For this reason, it is necessary to develop a technology that makes it possible to set the adhesive resin in correspondence to a given reflow temperature setting.

While an explanation is given above on an example in that an electronic component is soldered onto a component mounting board, the same concept applies when soldering a semiconductor chip to a chip mounting board and when soldering an electronic circuit module onto a motherboard.

Next, the compositions of the flux and the soldering paste that address the concerns discussed above are disclosed. Namely, the hardening agent in the flux should contain at least two types of carboxylic acids having melting points different from each other. The carboxylic acid with the lower melting point functions as a hardening agent at the reflow temperature. The carboxylic acid with the higher melting point, on the other hand, lowers the viscosity of the adhesive resin at a repair temperature set higher than the reflow temperature.

Since the viscosity of the adhesive resin is lowered by raising the temperature of the flux to a level approximately matching the repair temperature to cause the carboxylic acid with the higher melting point to melt, the electronic component can be separated from the component mounting board. As a result, it is possible to re-solder the electronic component as in the prior art in which a rosin flux is used, while retaining the bonding function. An adhesive flux adopting such a composition is particularly beneficial when soldering large, expensive packages such as electronic circuit modules.

In addition, when carboxylic acids with different melting points are mixed, it is possible to vary the thermo-setting temperature of the adhesive resin. This allows the adhesive resin to be hardened at a given reflow temperature, thereby making it possible to adjust the reflow temperature in conformance to the melting points of the solder elements that are used.

Furthermore, by combining various carboxylic acids or changing the mixing ratio thereof, too, the thermo-setting temperature of the adhesive resin can be adjusted, to achieve similar effects and advantages.

Next, the soldering paste should contain the flux assuming the composition described above and soldering powder. As a result, the soldering paste, too, achieves effects and advantages similar to those realized in the flux assuming the composition described above. The effects and advantages are now explained in more specific terms in reference to test data.

Test 1: Repairability Achieved by Combining a Plurality of Carboxylic Acids

First, test 1 was conducted to obtain a flux and a soldering paste achieving outstanding repairability. In tests 1, bisphenol A was used as the thermo-setting resin. The hardening agent was constituted by using two different carboxylic acids, and more specifically, by using adipic acid and pimelic acid. Both adipic acid and pimelic acid belong to the carboxylic acid group. Adipic acid and pimelic acid have different melting points. More specifically, the melting point of adipic acid is 153° C., whereas the melting point of pimelic acid is 279° C. Bisphenol A, adipic acid and pimelic acid were mixed at the mixing ratios (mass %) listed in TABLE II n below to prepare flux samples 1 through 4. The ratio of the adipic acid content a (mass %) and the pimelic acid content b (mass %) is varied within a range expressed as a:b=(50:50) to (95:5) when a+b=100 among flux samples 1 through 4. Bisphenol A and adipic acid were mixed at the mixing ratio (mass %) in TABLE II below to prepare flux sample 5.

TABLE II

|  |  | sample 1 | sample 2 | sample 3 | sample 4 | sample 5 |
|---|---|---|---|---|---|---|
| mixing ratio (mass %) | bisphenol A | 1 | 1 | 1 | 1 | 1 |
|  | adipic acid | 0.5 | 0.75 | 0.85 | 0.95 | 1 |
|  | pimelic acid | 0.5 | 0.25 | 0.15 | 0.05 | 0 |

Next, soldering pastes were prepared by mixing soldering powder into flux samples 1 through 5 prepared as described above. The soldering powder was constituted of Sn-3.5Ag. The composition of the soldering powder can be selected in correspondence to the reflow temperature, and soldering powder assuming a composition other than that used in this example may be adopted. The quantity of the flux that was mixed relative to the quantity of the soldering powder to constitute a soldering paste was set at 25 mass %. However, the quantity of the flux that is mixed in, too, can be set freely.

An electronic circuit module was soldered onto a motherboard using each of the soldering pastes assuming the compositions described above. FIGS. 22 through 25 present partial cross-sectional views illustrating the process through which the electronic circuit module was soldered onto the motherboard. In the figures, the same reference numerals are assigned to portions identical to those shown in FIG. 19.

Figure 22:
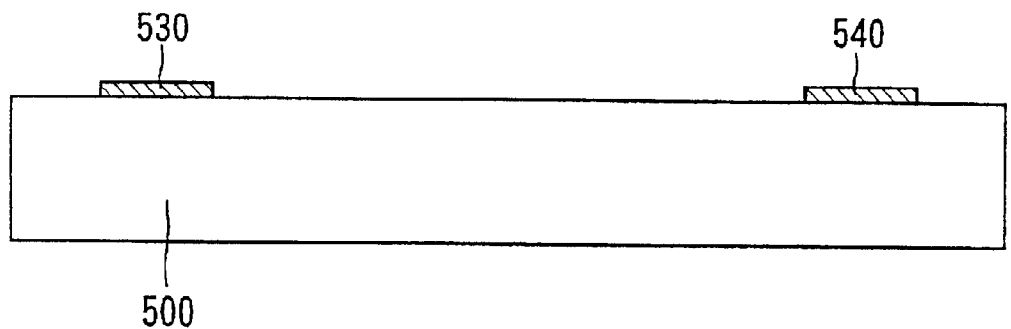
FIG. 22 presents a partial cross-sectional view illustrating the process of soldering an electronic circuit module onto the motherboard.

As shown in FIG. 22, lands 530 and 540 were provided at the motherboard 500. The motherboard 500 may be constituted of a ceramic substrate, an organic resin substrate or a material achieved through a combination thereof. The motherboard 500 in the figure is constituted of an organic resin substrate.

Figure 23:
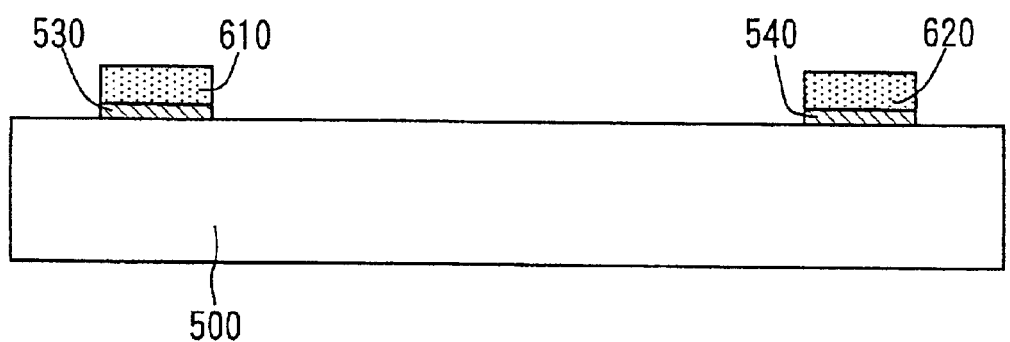
FIG. 23 presents a partial cross-sectional view illustrating the step implemented following the step shown in FIG. 22.

As shown in FIG. 23, a soldering paste 610 and 620 achieved in embodiment 10 was applied onto the lands 530 and 540 at the motherboard 500. The soldering paste 610 and 620 was applied through a printing process implemented by using a metal mask.

Figure 24:
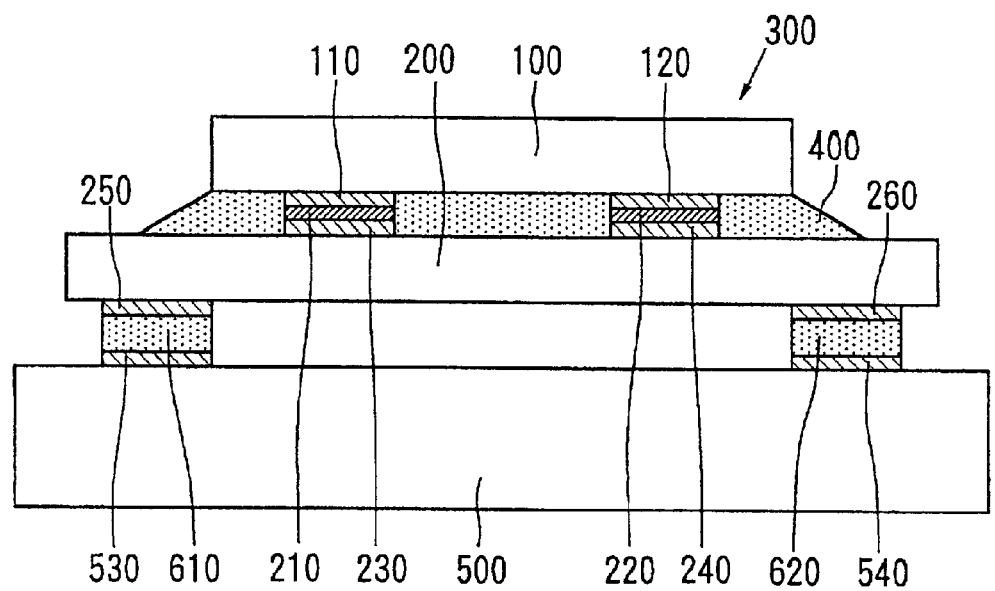
FIG. 24 presents a partial cross-sectional view illustrating the step implemented following the step shown in FIG. 23.

Then, as shown in FIG. 24, an electronic circuit module 300 was mounted onto the motherboard 500. The electronic circuit module 300 in the figure assumed a structure similar to that of the electronic circuit module shown in FIG. 12. The electronic circuit module 300 was a CSP (chip-size package) electronic circuit module that is referred to as an LGA-structured product. The chip mounting board 200 of the electronic circuit module 300 is a ceramic substrate. As illustrated in FIG. 24, the electronic circuit module 300 was set on the motherboard 500 so as to position terminal electrodes 250 and 260 onto the soldering paste 610 and 620.

Figure 25:
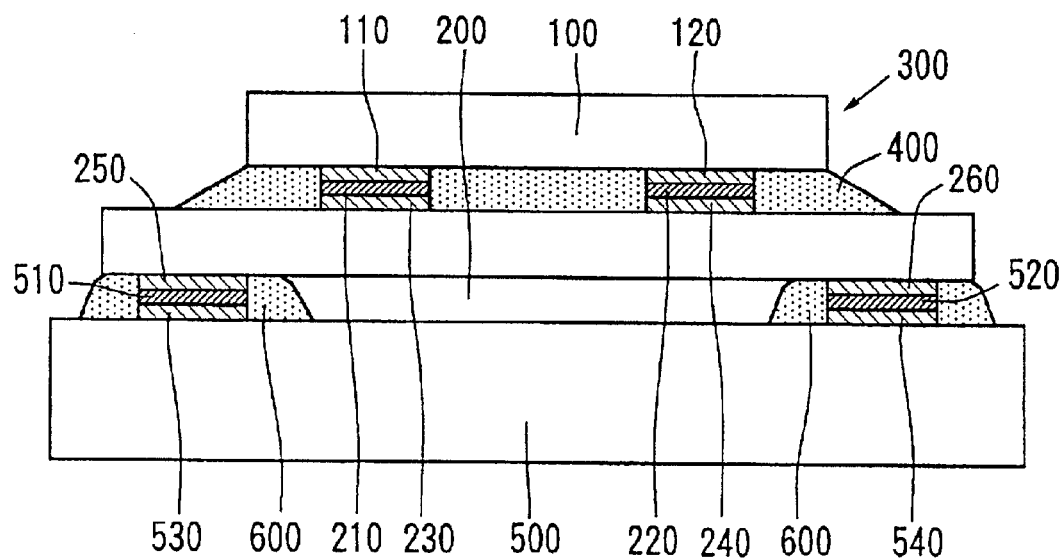
FIG. 25 presents a partial cross-sectional view illustrating the step implemented following the step shown in FIG. 24.

Next, the motherboard 500 mounted with the electronic circuit module 300 was processed in a reflow furnace to bond the terminal electrodes 250 and 260 provided at the electronic circuit module 300 with the soldering elements contained in the soldering paste 610 and 620. The adhesive resin and the hardening agent included in the soldering paste 610 and 620 were present between the electronic circuit module 300 and the motherboard 500 to bond them together around the solder bumps 510 and 520. As a result, an electronic circuit apparatus according to the present invention was obtained as shown in FIG. 25. In FIG. 25, reference numeral 600 indicates the flux achieved in embodiment 10 that was contained in the soldering paste 610 (620), and subsequently formed fillets on the outer sides of the terminal electrodes 250 and 260.

As explained earlier, the flux 600 contained the adhesive resin and the hardening agent. The hardening agent contained adipic acid and pimelic acid having melting points different from each other. Adipic acid with the lower melting point functioned as a hardening agent at the reflow temperature. Pimelic acid with the higher melting point lowered the viscosity of the adhesive resin at the repair temperature set higher than the reflow temperature.

The following is a detailed explanation of the individual flux samples 1 through 5. When flux sample 5 was used, adipic acid contained in the flux became melted, causing the solder to melt during the reflow furnace process. As a result, the lands formed at the motherboard and the terminal electrodes at the electronic circuit module became bonded to each other.

When flux samples 1 and 2 were used, the solder did not melt during the reflow furnace process due to the pimelic acid hardening process contained in the fluxes that continued in the reflow furnace. As a result, the lands at the motherboard and the terminal electrodes at the electronic circuit module failed to bond to each other.

When flux samples 3 and 4 were used, adipic acid contained in the flux became melted, causing the solder to melt during the reflow furnace process. As a result, the lands 530 and 540 formed at the motherboard 500 and the terminal electrodes 250 and 260 at the electronic circuit module 300 became bonded to each other.

Figure 26:
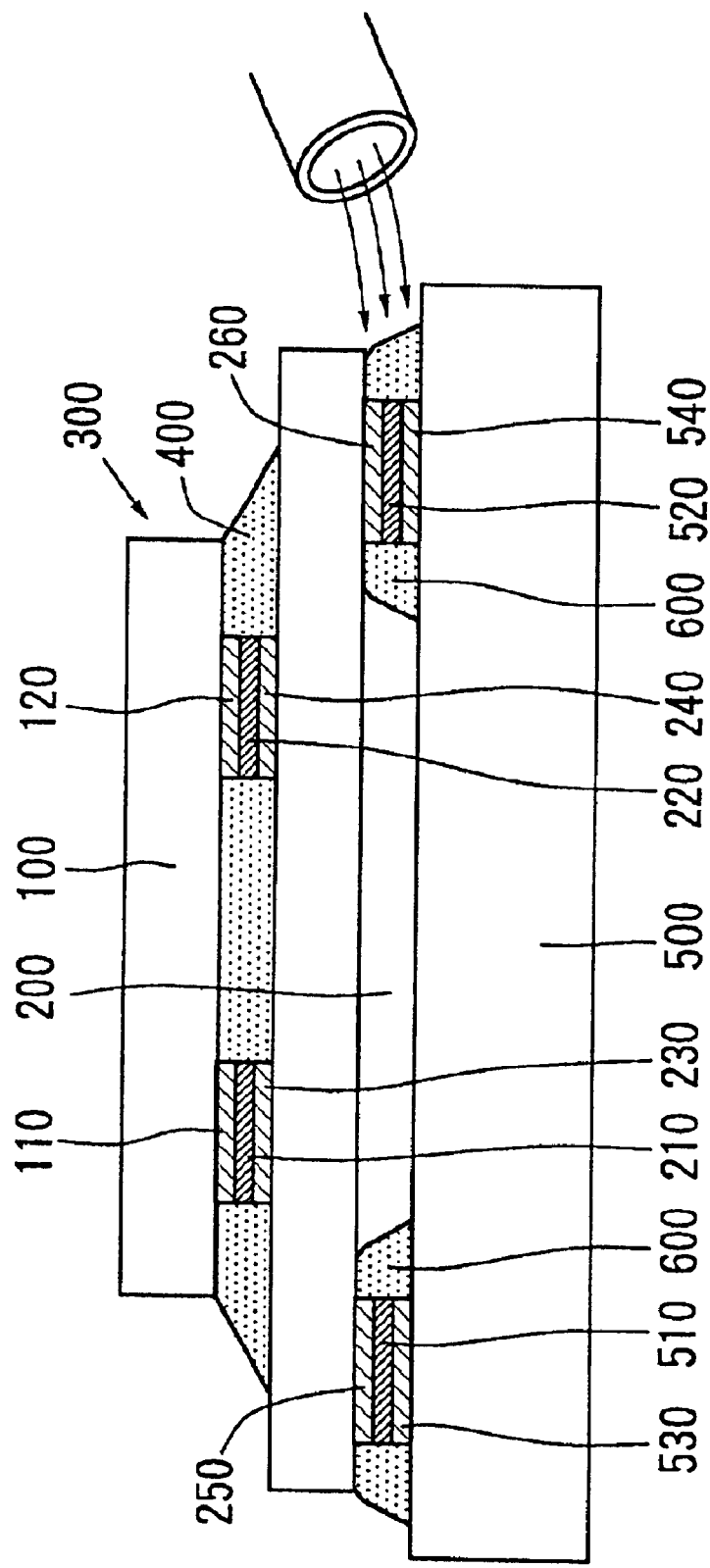
FIG. 26 presents a partial cross-sectional view illustrating the process of removing an electronic circuit module from the motherboard.
Figure 27:
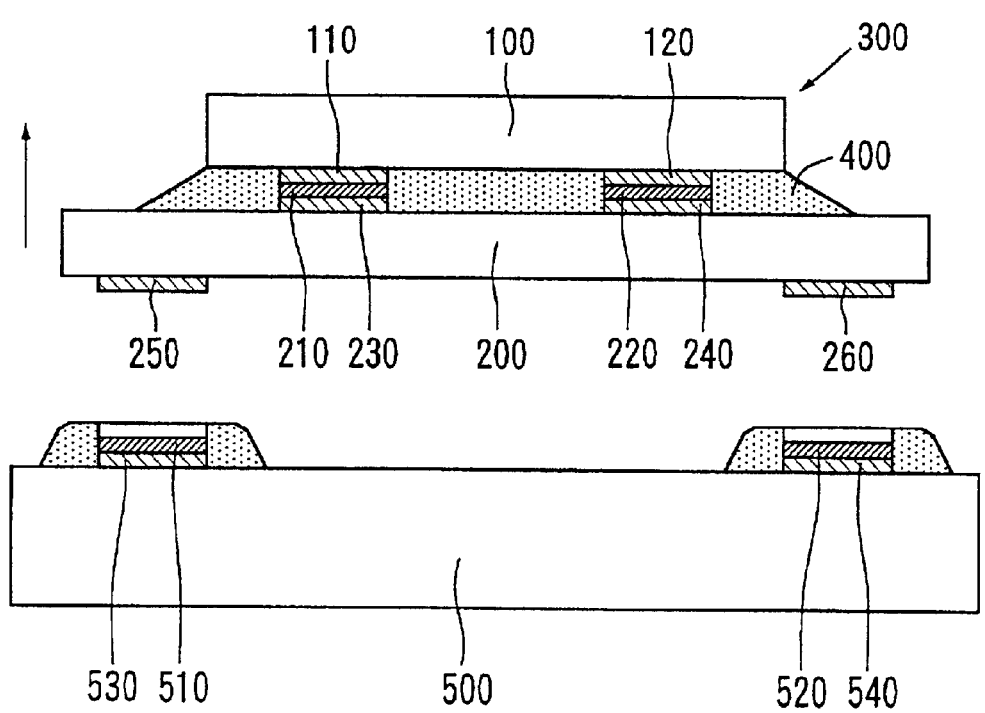
FIG. 27 presents a partial cross-sectional view illustrating the step implemented following the step shown in FIG. 26.

FIGS. 26 and 27 present partial cross-sectional views illustrating the process through which the electronic circuit module is separated from compared the motherboard. As shown in FIG. 26, hot air is blown onto the flux 600 to raise the temperature of the flux 600 to approximately match the repair temperature, thereby causing the pimelic acid with the higher melting point to become melted and thus lowering the viscosity of the adhesive resin. Consequently, the electronic circuit module 300 can be separated from the motherboard 500 as illustrated in FIG. 27.

As a result, it becomes possible to re-solder the electronic circuit module 300 as in the prior art in that a rosin flux is used, while sustaining the adhesive function. The adhesive flux assuming such a composition is particularly advantageous in application in that an expensive electronic circuit module 300 such as a large package is soldered. In addition, the repair process can be executed using the adhesive flux at a similar level of ease of work compared to that in the prior art.

The repair process is now explained in detail. Repair tests were conducted on flux samples 3 through 5 that enabled reflow mounting among flux samples 1 through 5. In the repair tests, hot air achieving a temperature of approximately 300° C. was blown into the area where the chip mounting board 200 of the electronic circuit module 300 and the motherboard 500 were bonded to each other.

Flux sample 5 bonding the chip mounting board of the electronic circuit module and the motherboard to each other first become softened but was caused to hardened again by the hot air. As a result, the electronic circuit module could not be peeled off the motherboard.

When hot air was blown into the area where the chip mounting board 200 of the electronic circuit module 300 and the motherboard 500 were bonded to each other by using the flux 600 in sample 3 or 4, pimelic acid contained in the flux 600 became melted again, and thus, it was possible to peel off the electronic circuit module 300 from the motherboard 500.

This leads to the conclusion that in order to enable repair work to soldered electronic circuit module 300, pimelic acid having a melting point that is close to the repair temperature should be mixed in addition to adipic acid, that is used to harden the adhesive resin. When the pimelic acid melts at the repair temperature, the viscosity of the adhesive resin is reduced. Consequently, the electronic circuit module 300 having been soldered onto the motherboard 500 can be separated from the motherboard 500 for repair.

The results of test 1 described above indicate that it is desirable to add pimelic acid for repair purposes at 15 mass % to 5 mass % relative to the content of adipic acid to be used to harden the adhesive resin. Namely, the adipic acid content a (mass %) and the pimelic acid content b (mass %) should satisfy a:b=(85:15) to (95:5) when a+b=100.

The soldering process was implemented using the soldering pastes obtained by mixing the fluxes prepared in test 1 with soldering powder. However, similar effects and advantages may be achieved in a soldering process implemented by applying the fluxes prepared in test 1 onto a substrate having solder bumps formed thereupon instead.

The electronic component device according to the present invention does not have any substantial difference from the electronic circuit apparatus described earlier except that the electronic circuit module is replaced by an electronic component and the motherboard is replaced by a component mounting board in the electronic component device. In other words, the basic structure assumed in the electronic component device according to the present invention is essentially the same as that disclosed in reference to the electronic circuit apparatus.

Likewise, the electronic circuit module according to the present invention does not have any substantial difference from the electronic circuit apparatus described earlier except that the electronic circuit module is replaced by a semiconductor chip and the motherboard is replaced by a chip mounting board in the electronic circuit module. In other words, the basic structure assumed in the electronic circuit module according to the present invention is essentially the same as that disclosed in reference to the electronic circuit apparatus. Next, the following tests 2 through 5 were conducted to achieve variance in the reflow temperature.

Test 2: Thermo-setting Characteristics of Fluxes Containing a Single Carboxylic Acid.

First, the thermo-setting characteristics of fluxes each prepared by mixing in a single carboxylic acid as a hardening agent were examined through test 2. The thermo-setting resin was constituted of bisphenol A. The hardening agent in each of the fluxes was constituted of one of adipic acid, maleic acid, succinic acid and pimelic acid, as shown in TABLE III below. Each flux was prepared by mixing the thermo-setting resin and the hardening agent at a mass ratio of 1:1. 2 g of each of the fluxes thus prepared was applied onto a Cu plate, the Cu plate was then processed in a reflow furnace at 240° C. and the behaviors of the films formed on the Cu plates were compared with one another.

was confirmed that the process of thermo-setting is further promoted as the melting point of the hardening agent becomes higher with the hardening process of the flux-containing adipic acid as the hardening agent (sample 11) slowed down to the greatest degree. If adipic acid and succinic acid are mixed together to constitute a hardening agent, a harder film is obtained by increasing the mixing ratio of the succinic acid.

Test 3: Variance in Reflow Temperature Achieved by Mixing a Plurality of Carboxylic Acids Based upon the results of test 2 described above, the variance in the reflow temperature achieved by mixing adipic acid and succinic acid was examined. Bisphenol A was used as the thermo-setting resin. The hardening agent was constituted by using two carboxylic acids, i.e. adipic acid and succinic acid. Both adipic acid and succinic acid belong to the carboxylic acid group. The melting points of adipic acid and succinic acid are different from each other. More specifically, the melting point of adipic acid is 153° C., whereas the melting point of succinic acid is 188° C. Bisphenol A, adipic acid and succinic acid were mixed at a mass ratio of 1:0.5: 0.5 to prepare a flux.

Next, the prepared flux was mixed with soldering powder to prepare a soldering paste. The soldering powder was constituted of Sn-3.5Ag, and the quantity of the flux that was mixed relative to the quantity of the soldering powder was 15 mass %. Hereafter, this soldering paste is referred to as soldering paste sample 22. The composition of the soldering powder may be selected in conformance to the reflow temperature, and thus, the soldering powder may assume a composition other than that described above. The quantity of the flux that is mixed, too, can be freely set.

In addition, bisphenol A and adipic acid were mixed at a mass ratio of 1:1 to prepare a flux. Then, the flux thus prepared was mixed with soldering powder to prepare a soldering paste. As in the case of soldering paste sample 22, the soldering powder was constituted of Sn-3.5Ag and the quantity of the flux that was mixed relative to the quantity of the soldering powder was set at 15 mass %. Hereafter, this soldering paste is referred to as soldering paste sample 21.

Figure 28:
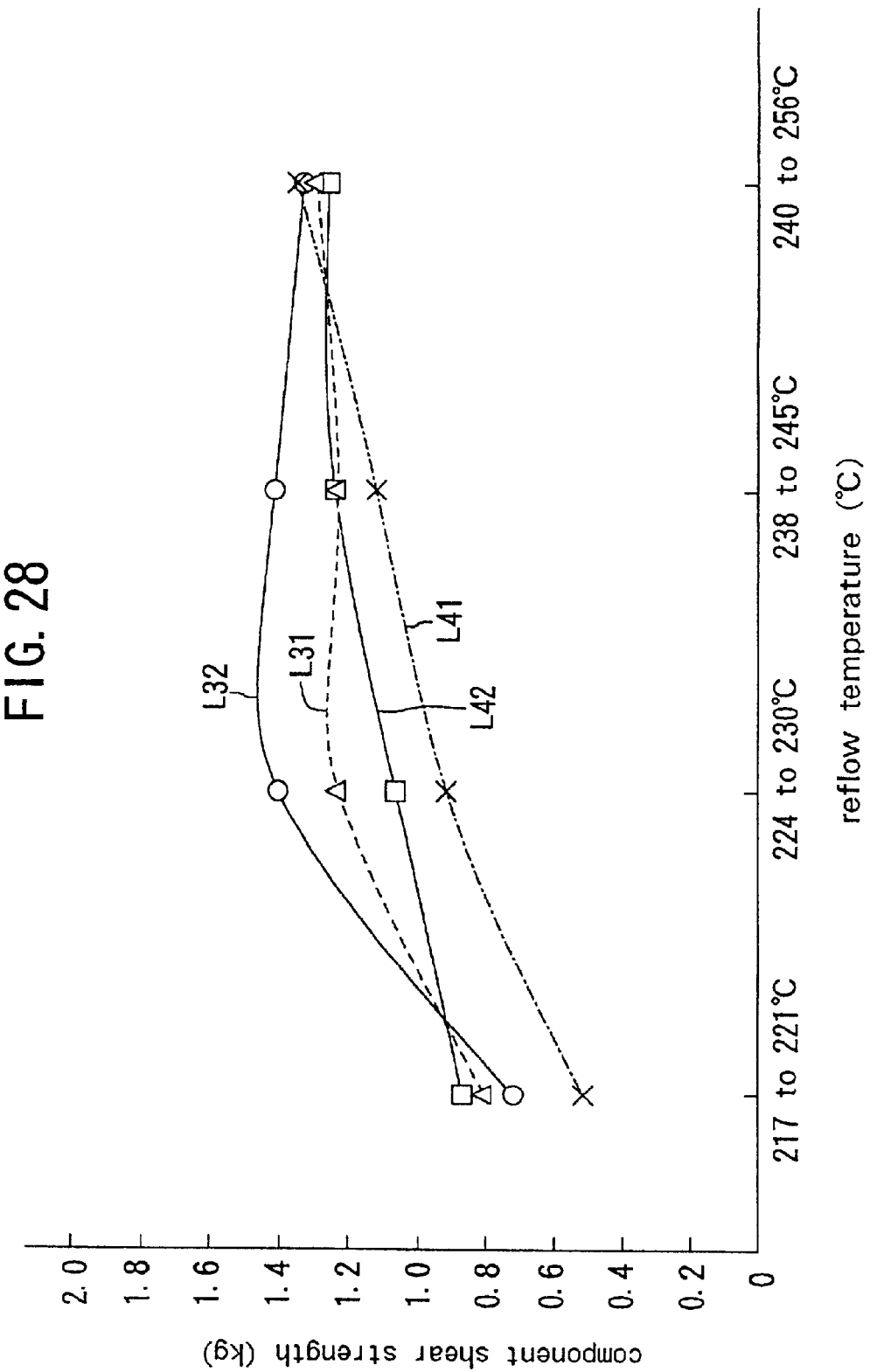
FIG. 28 shows the relationships between the reflow temperature and the component shear strength observed when capacitors are soldered by using soldering paste samples 21 and 22.

FIG. 28 shows relationships between the reflow temperature and the component shear strength observed when capacitors were soldered using soldering paste samples 21 and 22. Two different types of test capacitors, i.e., 1005-size STD terminal capacitors and 1005-size CSB terminal capacitors, were used in the test. An STD terminal capacitor includes terminals formed at the two side surfaces of the capacitor element assembly. A CSB terminal capacitor includes terminals formed at the two ends of the bottom surface of the capacitor element assembly.

TABLE III

|  | sample 11 | sample 12 | sample 13 | sample 14 |
|---|---|---|---|---|
| thermo-setting resin | bisphenol A | bisphenol A | bisphenol A | bisphenol A |
| hardening agent | adipic acid | maleic acid | succinic acid | pimelic acid |
| melting point of hardening agent | 153° C. | 133° C. | 188° C. | 279° C. |
| film behaviour | gelled | hardened at room temperature | hardened | hardened |

As shown in TABLE III, flux samples 11 and 12 that manifested gelling of the film or hardening of the film at room temperature, are not desirable. In contrast, flux samples 13 and 14, that allowed the films to harden in the reflow furnace process, achieved desirable results.

Through a comparison of the extents to which the process of hardening progressed in flux samples 11 through 14, it In FIG. 28, the characteristics L31 were achieved by using soldering paste sample 21 to solder STD terminal capacitors, characteristics L32 were achieved by using soldering paste sample 22 to solder STD terminal capacitors, the characteristics L41 were achieved by using soldering paste sample 21 to solder CSB terminal capacitors and characteristics L42 were achieved by using soldering paste sample 22 to solder CSB terminal capacitors. The component shear strength was measured through the method illustrated in FIG. 2.

As shown in FIG. 28, when soldering STD terminal capacitors, a degree of component shear strength equivalent to that realized with soldering paste sample 21 (see the characteristics L31) was achieved by using soldering paste sample 22 (see the characteristics L32) at a lower reflow temperature.

In addition, when soldering CSB terminal capacitors, a degree of component shear strength equivalent to that realized with soldering paste sample 21 (see the characteristics L41) was achieved by using soldering paste sample 22 (see the characteristics L42) at a lower reflow temperature. For instance, assuming that 0.9 kg of component shear strength is required, the reflow temperature must be set to 224 to 230° C. in conjunction with soldering paste sample 21 (see the characteristics L41), whereas the reflow temperature only needs to be set to 217 to 221° C. when soldering paste sample 22 (see the characteristics L42) is used to achieve the required component shear strength.

As explained above, by mixing carboxylic acids (adipic acid and succinic acid) with melting points different from each other, the variance in thermo-setting temperature of the adhesive resin (bisphenol A) can be achieved. As a result, it becomes possible to harden the adhesive resin (bisphenol A) at a desired reflow temperature, that means that the reflow temperature can be adjusted in correspondence to the melting point of the solder element that is used. Thus, the reflow temperature does not need to be fixed to a specific value.

In addition, the thermo-setting temperature of the adhesive resin (bisphenol A) can also be varied by using a different combination of carboxylic acids in the mixture (adipic acid and succinic acid) to achieve similar effects and advantages. For instance, by switching to a combination of adipic acid and pimelic acid from the combination of adipic acid and succinic acid, the thermo-setting temperature of the adhesive resin (bisphenol A) is changed.

Test 4: Variance in Reflow Temperature Achieved Through Adjustment of Carboxylic Acid Mixing Ratio Next, the variance in the reflow temperature achieved by adjusting the mixing ratio of carboxylic acids (adipic acid and succinic acid) in the mixture was examined. Bisphenol A was used as the thermo-setting resin. The hardening agent was constituted by using adipic acid and succinic acid bisphenol A, adipic acid and succinic acid were mixed at mixing ratios (mass %) in TABLE IV below to prepare fluxes. The adipic acid content a (mass %) and the succinic acid content c (mass %) were varied within the range of a:c=(100:0) to (0:100) when a+c=100 among these fluxes.

Soldering powder was mixed with the individual fluxes prepared, and soldering paste samples 50 through 55 were prepared. The soldering powder was constituted of eutectic solder (Sn63-Pb37) powder. The quantity of the flux that was mixed relative to the quantity of the soldering powder in each sample was set at 15 mass %. The composition of the soldering powder may be selected in correspondence to the reflow temperature setting, and thus, soldering powder with a different composition may be used. The quantity of the flux that is added, too, may be set freely as well.

TABLE IV

|  |  | sample 50 | sample 51 | sample 52 | sample 53 | sample 54 | sample 55 |
|---|---|---|---|---|---|---|---|
| mixing ratio ratio (mass %) | bisphenol A | 1 | 1 | 1 | 1 | 1 | 1 |
|  | adipic acid | 1 | 0.95 | 0.75 | 0.5 | 0.25 | 0 |
|  | succinic acid | 0 | 0.05 | 0.25 | 0.5 | 0.75 | 1 |
| soldering powder |  | eutectic | eutectic | eutectic | eutectic | eutectic | eutectic |
| soldering results |  | OK | OK | OK | OK | OK | NG |

As shown in TABLE IV, terminals were connected in a desirable manner through soldering by using soldering paste sample 50. However, soldering paste sample 50, that only contains adipic acid as the hardening agent, does not allow the thermo-setting temperature of the adhesive resin (bisphenol A) to be varied and thus, does not allow the reflow temperature to be varied either.

In addition, the flux in soldering paste sample 55 became hardened before the solder melted, and, as a result, the terminals could not be bonded with soldering paste sample 55.

In contrast, terminals were connected in a desirable manner through soldering by using soldering paste samples 51 through 54.

Figure 29:
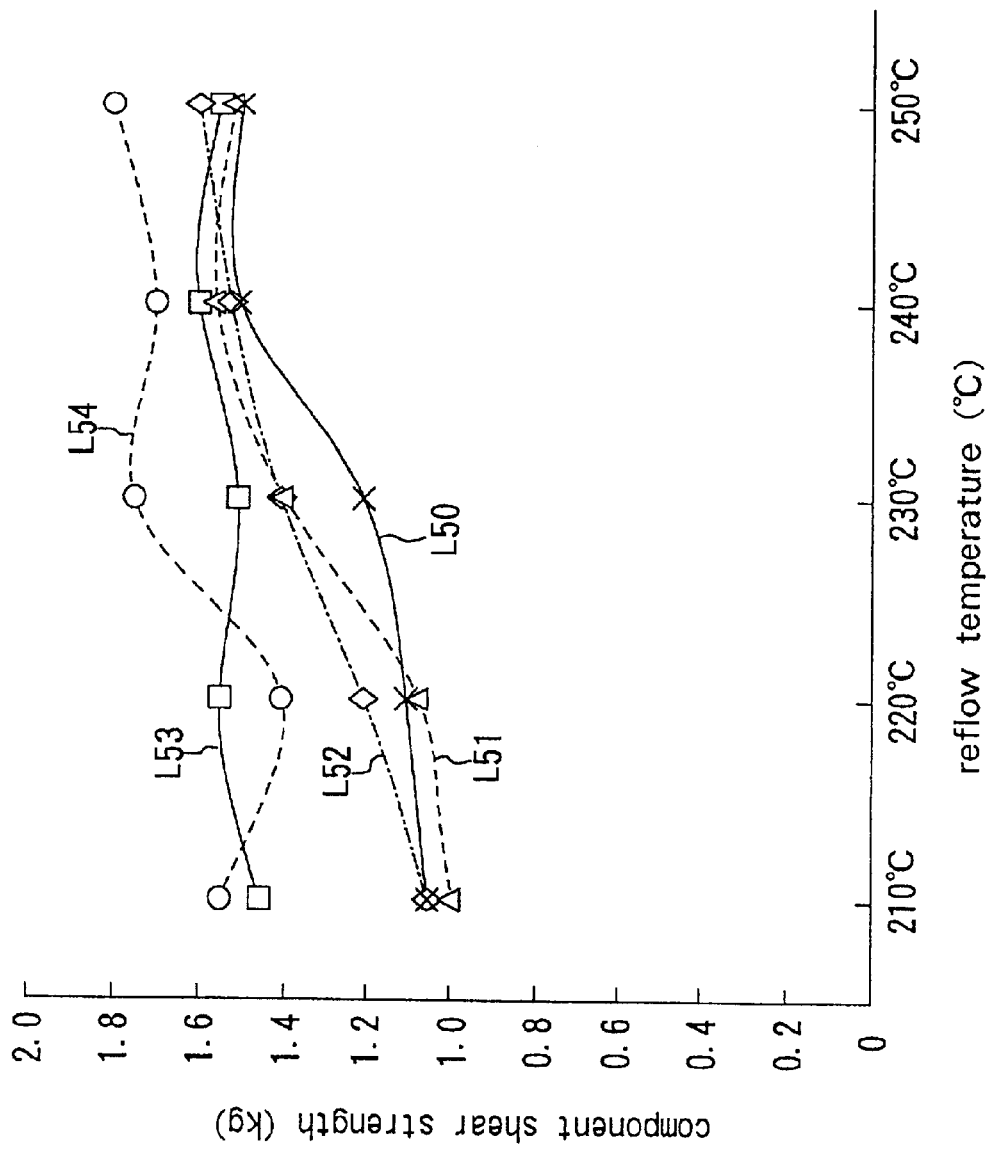
FIG. 29 shows the relationships between the reflow temperature and the component shear strength observed when capacitors are soldered by using soldering paste samples 50 to 54.

FIG. 29 shows relationships between the reflow temperature and the component shear strength observed when capacitors were soldered with soldering paste samples 50 through 54. 1005-size STD terminal capacitors were used in the test. In FIG. 29, the characteristics L50 to L54 respectively represent the characteristics achieved by using soldering paste samples 50 through 54.

The required component shear strength can be assured even at a low reflow temperature by increasing the succinic acid content. For instance, assuming that 1.4 kg of component shear strength is required, the reflow temperature needs to be set at 230° C. in conjunction with soldering paste sample 52 (see the characteristics L52). In contrast, soldering paste sample 53 (see the characteristics L53) with a higher succinic acid content than sample 52 only requires the reflow temperature to be set to 210° C.

As explained above, by changing the mixing ratio of the carboxylic acids (adipic acid and succinic acid) in the mixture, the thermo-setting temperature of the adhesive resin (bisphenol A) can be adjusted. As a result, it becomes possible to harden the adhesive resin (bisphenol A) at any reflow temperature, that means that the reflow temperature can be adjusted in correspondence to the melting point of the solder element that is used. Thus, the reflow temperature does not need to be fixed to a specific value.

The results of test 4 described above indicate that it is desirable that the adipic acid content a (mass %) and the succinic acid content c (mass %) satisfy a:c=(95:5) to (25:75) with a+c=100, when adipic acid and succinic acid are mixed to constitute the hardening agent to be used in conjunction with a eutectic solder (Sn63-Pb37) constituting the solder element.

Test 5: Varying Solder Element to be Combined with Flux

The solder element used in test 4 was constituted of a eutectic solder (Sn63-Pb37). The melting point of the eutectic solder (Sn63-Pb37) is 183° C. Now, a test (hereafter referred to as test 5) conducted by using Sn-3.5Ag solder to constitute the solder element unlike in test 4 is explained. The melting point of the Sn-3.5Ag solder is 217° C., that is considerably higher than the melting point, i.e. 183° C., of the eutectic solder (Sn63-Pb37).

Bisphenol A, adipic acid and succinic acid were mixed at a mixing ratio (mass %) in TABLE V to prepare fluxes. The adipic acid content a (mass %) and the succinic acid content c (mass %) were varied within the range of a:c=100:0 to 0:100 (a+c=100) among these fluxes.

Soldering powder was mixed with the individual fluxes prepared, and soldering paste samples 70 through 75 were prepared. The soldering powder was constituted of Sn-3.5Ag soldering powder. The quantity of the flux that was mixed relative to the quantity of the soldering powder in each sample was set at 15 mass %.

TABLE V

| | | sample 70 | sample 71 | sample 72 | sample 73 | sample 74 | sample 75 |
|---|---|---|---|---|---|---|---|
| mixing ratio (mass %) | bisphenol A | 1 | 1 | 1 | 1 | 1 | 1 |
| | adipic acid | 1 | 0.95 | 0.75 | 0.5 | 0.25 | 0 |
| | succinic acid | 0 | 0.05 | 0.25 | 0.5 | 0.75 | 1 |
| soldering powder | | Sn-3.5Ag | Sn-3.5Ag | Sn-3.5Ag | Sn-3.5Ag | Sn-3.5Ag | Sn-3.5Ag |
| soldering results | | OK | OK | NG | NG | NG | NG |

As shown in TABLE V, the fluxes in soldering paste samples 72 through 75 became hardened before the solder melted, and, as a result, the terminals could not be bonded with soldering paste samples 72 through 75.

In addition, terminals were connected in a desirable manner through soldering by using soldering paste samples 70 and 71.

The results of test 5 described above indicate that it is desirable that the adipic acid content a (mass %) and the succinic acid content c (mass %) satisfy a:c=(100:0) to (95:5) with a+c=100, when adipic acid and succinic acid are mixed to constitute the hardening agent to be used in conjunction with Sn-3.5Ag solder constituting the solder element.

In tests 3 through 5 described above, the soldering process was implemented by using soldering pastes obtained by mixing fluxes with soldering powder. However, similar effects and advantages may be achieved by implementing a soldering process with a flux directly applied onto a board having solder bumps formed thereupon.

It is obvious that an electronic circuit apparatus similar to the electronic circuit apparatus shown in FIG. 25 may be achieved by using any of the solderings pastes checked in tests 3 through 5. In addition, an electronic component device and an electronic circuit module can be also constituted by using any of the soldering tastes checked in tests 3 through 5.

Furthermore, by mixing carboxylic acids with different thermo-setting speeds from each other in the hardening agent, the speed with which the adhesive resin becomes thermally set can be varied. As a result, it becomes possible to adjust the reflow time or the reflow temperature in correspondence to the solder element that is used. For instance, when adipic acid and succinic acid are used in combination, the quantity of heat required to thermally set succinic acid is smaller than the quantity of heat required to thermally set adipic acid, and thus, the thermo-setting speed of succinic acid is higher than the thermo-setting speed of adipic acid. For this reason, it is possible to vary the thermo-setting speed of the adhesive resin (bisphenol A) by mixing adipic acid and succinic acid to constitutes the hardening agent, in order to adjust the reflow time or the reflow temperature. A similar advantage may be achieved through a different combination of carboxylic acids such as adipic acid and pimelic acid.

Moreover, the thermo-setting speed of the adhesive resin can also be varied by combining different carboxylic acids in the mixture or by changing the mixing ratio, to achieve similar effects and advantages.

Although not shown, in conjunction with the soldering paste according to the present invention, the flux according to the present invention may be used as a sealant to bond an electronic component to a component mounting board, a semiconductor chip to a chip mounting board or an electronic circuit module to a motherboard with the sealant.

Alternatively, a standard sealant may be formed at the upper layer of the flux according to the present invention applied onto a component mounting board.

INDUSTRIAL APPLICABILITY

As explained above, the present invention achieves the following advantages.

(a) A soldering flux, a soldering paste and a soldering method that achieve a sufficient degree of bonding strength even when components are mounted at a higher density, components are further miniaturized or components are set with a smaller pitch, are provided.

(b) A soldering flux, a soldering paste and a soldering method, that make it possible to prevent components from becoming lifted off or falling off from a double-sided installation type component mounting board with a high degree of reliability, are provided.

(c) An electronic component device, an electronic circuit module and an electronic circuit apparatus, that do not require a flux quashing process and thus can be manufactured at lower production cost are provided.

(d) An electronic component device, an electronic circuit module and an electronic circuit apparatus achieving a high degree of reliability by greatly increasing the durability of solder joints are provided.

What is claimed is:

1. A soldering flux comprising:
    an adhesive resin including a thermo-setting resin that starts heat-hardening approximately at the reflow temperature; and a hardening agent, wherein:
    said hardening agent including at least two types of carboxylic acids having melting points that are different from each other.

2. The soldering flux of claim 1, assuming a liquid form.

3. The soldering flux of claim 1, assuming a paste form.

4. The soldering flux of claim 1, wherein:
    said thermo-setting resin is selected from the group consisting of epoxy resin, phenol resin, polyimide resin, silicon resin, modified resin and acrylic resin.

5. The soldering flux of claim 1 wherein:
one of said two types of carboxylic acids is adipic acid and another of said two types of carboxylic acid is pimelic acid.

6. The soldering flux of claim 5, represented by the formula:

$$a:b=(85:15) \text{ to } (95:5)$$

wherein 'a' is content (mass %) of said adipic acid and 'b' is content (mass %) of said pimelic acid.

7. The soldering flux of claim 1, wherein:
one of said two types of carboxylic acids is adipic acid and another of said two types of carboxylic acids is succinic acid.

8. The soldering flux of claim 7, represented by the formula:

$$a:c=(95:5) \text{ to } (25:75)$$

wherein 'a' is content (mass %) of said adipic acid and 'c' is content (mass %) of said succinic acid.

9. A soldering paste comprising:
soldering powder; and
a soldering flux mixed with said soldering powder, wherein:
said soldering flux comprises an adhesive resin including a thermo-setting resin that starts heat-hardening approximately at the reflow temperature; and a hardening agent, and said hardening agent including at least two types of carboxylic acids having melting points that are different from each other.

10. The soldering paste of claim 9, wherein:
said thermo-setting resin is selected from the group consisting of epoxy resin, phenol resin, polyimide resin, silicon resin, modified resin and acrylic resin.

11. The soldering paste of claim 9 wherein:
one of said two types of carboxylic acids is adipic acid and another of said two types of carboxylic acid is pimelic acid.

12. The soldering paste of claim 11, represented by the formula:

$$a:b=(85:15) \text{ to } (95:5)$$

wherein 'a' is content (mass %) of said adipic acid and 'b' is content (mass %) of said pimelic acid.

13. The soldering paste of claim 9, wherein:
one of said two types of carboxylic acids is adipic acid and another of said two types of carboxylic acids is succinic acid.

14. The soldering paste of claim 13, represented by the formula:

$$a:c=(95:5) \text{ to } (25:75)$$

wherein 'a' is content (mass %) of said adipic acid and 'c' is content (mass %) of said succinic acid.

15. The soldering paste of claim 9, wherein:
said soldering powder includes a component selected from the group consisting of Sn, Cu, Ag, Sb, Pb, In, Zn and Bi.

16. An electronic component device comprising:
a component mounting board;
an electronic component soldered onto said component mounting board; and
a soldering flux between said component mounting board and said electronic component to bond said component mounting board and said electronic component to each other, wherein:
said soldering flux comprises an adhesive resin including a thermo-setting resin that starts heat-hardening approximately at the reflow temperature; and a hardening agent, and said hardening agent including at least two types of carboxylic acids having melting points that are different from each other.

17. The electronic component device of claim 16, wherein:
said soldering flux assumes a liquid form.

18. The electronic component device of claim 16, wherein:
said soldering flux assumes a paste form.

19. The electronic component device of claim 16, wherein:
said thermo-setting resin is selected from the group consisting of epoxy resin, phenol resin, polyimide resin, silicon resin, modified resin and acrylic resin.

20. The electronic component device of claim 16 wherein:
one of said two types of carboxylic acids is adipic acid and another of said two types of carboxylic acid is pimelic acid.

21. The electronic component device of claim 20, represented by the formula:

$$a:b=(85:15) \text{ to } (95:5)$$

wherein 'a' is content (mass %) of said adipic acid and 'b' is content (mass %) of said pimelic acid.

22. The electronic component device of claim 16, wherein:
one of said two types of carboxylic acids is adipic acid and another of said two types of carboxylic acids is succinic acid.

23. The electronic component device of claim 22, represented by the formula:

$$a:c=(95:5) \text{ to } (25:75)$$

wherein 'a' is content (mass %) of said adipic acid and 'c' is content (mass %) of said succinic acid.

24. An electronic circuit module comprising:
a chip mounting board;
a semiconductor chip having at least one semiconductor element soldered onto said chip mounting board; and
a soldering flux between said chip mounting board and said semiconductor chip to bond said chip mounting board and said semiconductor chip to each other, wherein:
said soldering flux comprises an adhesive resin including a thermo-setting resin that starts heat-hardening approximately at the reflow temperature; and a hardening agent, and said hardening agent including at least two types of carboxylic acids having melting points that are different from each other.

25. The electronic circuit module of claim 24, wherein:
said soldering flux assumes a liquid form.

26. The electronic circuit module of claim 24, wherein:
said soldering flux assumes a paste form.

27. The electronic circuit module of claim 24, wherein:
said thermo-setting resin is selected from the group consisting of epoxy resin, phenol resin, polyimide resin, silicon resin, modified resin and acrylic resin.

28. The electronic circuit module of claim 24 wherein:
one of said two types of carboxylic acids is adipic acid and another of said two types of carboxylic acid is pimelic acid.

29. The electronic circuit module of claim 28, represented by the formula:

$$a:b=(85:15) \text{ to } (95:5)$$

wherein 'a' is content (mass %) of said adipic acid and 'b' is content (mass %) of said pimelic acid.

30. The electronic circuit module of claim 24, wherein:
one of said two types of carboxylic acids is adipic acid and another of said two types of carboxylic acids is succinic acid.

31. The electronic circuit module of claim 30, represented by the formula:

$$a:c=(95:5) \text{ to } (25:75)$$

wherein 'a' is content (mass %) of said adipic acid and 'c' is content (mass %) of said succinic acid.

32. An electronic circuit apparatus comprising:
a motherboard;
an electronic circuit module soldered onto said motherboard; and
a soldering flux between said motherboard and said electronic circuit module to bond said motherboard and said electronic circuit module to each other, wherein:
said soldering flux comprises an adhesive resin including a thermo-setting resin that starts heat-hardening approximately at the reflow temperature; and a hardening agent, and said hardening agent including at least two types of carboxylic acids having melting points that are different from each other.

33. The electronic circuit apparatus of claim 32, wherein:
said soldering flux assumes a liquid form.

34. The electronic circuit apparatus of claim 32, wherein:
said soldering flux assumes a paste form.

35. The electronic circuit apparatus of claim 32, wherein:
said thermo-setting resin is selected from the group consisting of epoxy resin, phenol resin, polyimide resin, silicon resin, modified resin and acrylic resin.

36. The electronic circuit apparatus of claim 32 wherein:
one of said two types of carboxylic acids is adipic acid and another of said two types of carboxylic acid is pimelic acid.

37. The electronic circuit apparatus of claim 36, represented by the formula:

$$a:b=(85:15) \text{ to } (95:5)$$

wherein 'a' is content (mass %) of said adipic acid and 'b' is content (mass %) of said pimelic acid.

38. The electronic circuit apparatus of claim 32, wherein:
one of said two types of carboxylic acids is adipic acid and another of said two types of carboxylic acids is succinic acid.

39. The electronic circuit apparatus of claim 38, represented by the formula:

$$a:c=(95:5) \text{ to } (25:75)$$

wherein 'a' is content (mass %) of said adipic acid and 'c' is content (mass %) of said succinic acid.

40. A soldering method implemented by using a flux, wherein:
said flux comprises:
an adhesive resin including a thermo-setting resin that starts heat-hardening approximately at the reflow temperature; and
a hardening agent
including at least two types of carboxylic acids having melting points that are different from each other.

41. The soldering method of claim 40, implemented to solder any one of an electronic component, an electronic circuit module and a semiconductor chip onto a board.

42. A soldering method implemented by using a soldering paste comprising soldering powder mixed with a soldering flux, wherein:
said soldering flux comprises:
an adhesive resin including a thermo-setting resin that starts heat-hardening approximately at the reflow temperature; and
a hardening agent including at least two types of carboxylic acids having melting points that are different from each other.

43. The soldering method of claim 42, implemented to solder any one of an electronic component, an electronic circuit module and a semiconductor chip onto a board.

44. The soldering method of claim 42, including the steps of:
executing a soldering process at one surface of said board by using said soldering paste, and
soldering an electronic component onto another surface of said board with a solder different from said soldering paste.

45. A soldering flux comprising:
an adhesive resin including a thermo-setting resin; and
a hardening agent including two types of carboxylic acids having melting points that are different from each other, wherein:
the carboxylic acid with the lower melting point functions as a hardening agent at the reflow temperature; and
the carboxylic acid with the higher melting point melts at a repair temperature set higher than the reflow temperature, and thereby lowers the viscosity of said adhesive resin.

46. The soldering flux of claim 45, wherein:
said thermo-setting resin starts heat-hardening approximately at said reflow temperature.

47. A soldering paste comprising:
soldering powder; and
a soldering flux mixed with said soldering powder, said soldering flux comprising:
an adhesive resin including a thermo-setting resin; and
a hardening agent including two types of carboxylic acids having melting points that are different from each other, wherein:
the carboxylic acid with the lower melting point functions as a hardening agent at the reflow temperature; and
the carboxylic acid with the higher melting point melts at a repair temperature set higher than the reflow temperature, and thereby lowers the viscosity of said adhesive resin.

48. The soldering paste of claim 47, wherein:
said thermo-setting resin starts heat-hardening approximately at said reflow temperature.

49. An electronic component device comprising:
a component mounting board;
an electronic component soldered onto said component mounting board; and
a soldering flux between said component mounting board and said electronic component to bond said component mounting board and said electronic component to each other, wherein:
said soldering flux comprises:
an adhesive resin including a thermo-setting resin; and
a hardening agent including two types of carboxylic acids having melting points that are different from each other, wherein:
the carboxylic acid with the lower melting point functions as a hardening agent at the reflow temperature; and
the carboxylic acid with the higher melting point melts at a repair temperature set higher than the reflow temperature, and thereby lowers the viscosity of said adhesive resin.

50. The electronic component device of claim 49, wherein:
said thermo-setting resin starts heat-hardening approximately at said reflow temperature.

51. An electronic circuit module comprising:
a chip mounting board;
a semiconductor chip having at least one semiconductor element soldered onto said chip mounting board; and
a soldering flux between said chip mounting board and said semiconductor chip to bond said chip mounting board and said semiconductor chip to each other, wherein:
said soldering flux comprises:
an adhesive resin including a thermo-setting resin; and
a hardening agent including two types of carboxylic acids having melting points that are different from each other, wherein:
the carboxylic acid with the lower melting point functions as a hardening agent at the reflow temperature; and
the carboxylic acid with the higher melting point melts at a repair temperature set higher than the reflow temperature, and thereby lowers the viscosity of said adhesive resin.

52. The electronic circuit module of claim 51, wherein:
said thermo-setting resin starts heat-hardening approximately at said reflow temperature.

53. An electronic circuit apparatus comprising:
a motherboard;
an electronic circuit module soldered onto said motherboard; and
a soldering flux between said motherboard and said electronic circuit module to bond said motherboard and said electronic circuit module to each other, wherein:
said soldering flux comprises:
an adhesive resin including a thermo-setting resin; and
a hardening agent including two types of carboxylic acids having melting points that are different from each other, wherein:
the carboxylic acid with the lower melting point functions as a hardening agent at the reflow temperature; and
the carboxylic acid with the higher melting point melts at a repair temperature set higher than the reflow temperature, and thereby lowers the viscosity of said adhesive resin.

54. The electronic circuit apparatus of claim 53, wherein:
said thermo-setting resin starts heat-hardening approximately at said reflow temperature.

55. A soldering method implemented by using a flux, wherein:
said flux comprises:
an adhesive resin including a thermo-setting resin; and
a hardening agent including two types of carboxylic acids having melting points that are different from each other, wherein:
the carboxylic acid with the lower melting point functions as a hardening agent at the reflow temperature; and
the carboxylic acid with the higher melting point melts at a repair temperature set higher than the reflow temperature, and thereby lowers the viscosity of said adhesive resin.

56. The soldering method of claim 55, wherein:
said thermosetting resin starts heat-hardening approximately at said reflow temperature.

57. The soldering method of claim 55, implemented to solder any one of an electronic component, an electronic circuit module and a semiconductor chip onto a board.

58. A soldering method implemented by using a soldering paste comprising soldering powder mixed with a soldering flux, wherein:
said soldering flux comprises:
an adhesive resin including a thermo-setting resin; and
a hardening agent including two types of carboxylic acids having melting points that are different from each other, wherein:
the carboxylic acid with the lower melting point functions as a hardening agent at the reflow temperature; and
the carboxylic acid with the higher melting point melts at a repair temperature set higher than the reflow temperature, and thereby lowers the viscosity of said adhesive resin.

59. The soldering method of claim 58, wherein:
said thermo-setting resin starts heat-hardening approximately at said reflow temperature.

60. The soldering method of claim 58, implemented to solder any one of an electronic component, an electronic circuit module and a semiconductor chip onto a board.

* * * * *

UNITED STATES PATENT AND TRADEMARK OFFICE
CERTIFICATE OF CORRECTION

PATENT NO. : 6,915,944 B1
DATED : July 12, 2005
INVENTOR(S) : Minoru Takaya et al.

It is certified that error appears in the above-identified patent and that said Letters Patent is hereby corrected as shown below:

Column 9,
Line 8, "100 $\mu$tm" should read -- 100$\mu$m --.

Column 12,
Line 54, "FI G." should read -- FIG. --.

Column 15,
Line 47, "greater, durability" should read -- greater durability --.

Column 18,
Line 61, "TABLE II n" should read -- TABLE II --.

Column 23,
Line 56, "succinic acid" should read -- succinic acid. --.

Signed and Sealed this

Twenty-fifth Day of October, 2005

JON W. DUDAS
*Director of the United States Patent and Trademark Office*